(12) United States Patent
von Kluge

(10) Patent No.: US 9,209,174 B2
(45) Date of Patent: Dec. 8, 2015

(54) CIRCUIT ELEMENT INCLUDING A LAYER OF A STRESS-CREATING MATERIAL PROVIDING A VARIABLE STRESS AND METHOD FOR THE FORMATION THEREOF

(71) Applicant: GLOBALFOUNDRIES Inc., Grand Cayman (KY)

(72) Inventor: Johannes von Kluge, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 221 days.

(21) Appl. No.: 13/768,275

(22) Filed: Feb. 15, 2013

(65) Prior Publication Data

US 2014/0232433 A1    Aug. 21, 2014

(51) Int. Cl.
| | | |
|---|---|---|
| H01L 29/78 | (2006.01) | |
| H01L 29/66 | (2006.01) | |
| H01L 27/088 | (2006.01) | |
| G05F 3/02 | (2006.01) | |
| H01L 21/66 | (2006.01) | |
| H03K 19/20 | (2006.01) | |
| H01L 49/02 | (2006.01) | |
| H01L 29/8605 | (2006.01) | |

(Continued)

(52) U.S. Cl.
CPC .............. *H01L 27/088* (2013.01); *G05F 3/02* (2013.01); *H01L 22/30* (2013.01); *H01L 28/20* (2013.01); *H01L 29/6653* (2013.01); *H01L 29/6656* (2013.01); *H01L 29/6659* (2013.01); *H01L 29/66477* (2013.01); *H01L 29/78* (2013.01); *H01L 29/7833* (2013.01); *H01L 29/7842* (2013.01); *H01L 29/8605* (2013.01); *H03K 19/017* (2013.01); *H03K 19/20* (2013.01); *H01L 21/823807* (2013.01); *H01L 27/092* (2013.01); *H01L 29/665* (2013.01)

(58) Field of Classification Search
CPC ..................................................... H01L 29/7849
USPC ...................... 326/112; 257/401, 402, 48, 368
See application file for complete search history.

(56) References Cited

U.S. PATENT DOCUMENTS

2008/0067618 A1    3/2008   Wang et al.
2008/0286918 A1*  11/2008   Shaviv .......................... 438/211

(Continued)

FOREIGN PATENT DOCUMENTS

TW          200908326          2/2009

OTHER PUBLICATIONS

Agnus et al., "Dry Etching of Single Crystal PMN-PT Piezoelectric Material," 24th Int'l Conference on Mico Electro Mechanical Systems, MEMS'11, Cancun, Mexico, 2011.

(Continued)

Primary Examiner — Daniel D Chang
(74) Attorney, Agent, or Firm — Amerson Law Firm, PLLC

(57) ABSTRACT

A transistor includes a source region, a drain region, a channel region, a gate electrode and a layer of a stress-creating material. The stress-creating material provides a stress that is variable in response to a signal acting on the stress-creating material. The layer of stress-creating material is arranged to provide a stress in at least the channel region. The stress provided in at least the channel region is variable in response to the signal acting on the stress-creating material. Layers of stress-creating material providing a stress that is variable in response to a signal acting on the stress-creating material may also be used in circuit elements other than transistors, for example, resistors.

26 Claims, 10 Drawing Sheets

(51) Int. Cl.
*H03K 19/017* (2006.01)
*H01L 21/8238* (2006.01)
*H01L 27/092* (2006.01)

(56) References Cited

U.S. PATENT DOCUMENTS

2008/0303068 A1   12/2008   Grill et al.
2011/0241084 A1*  10/2011   Wu et al. .................. 257/288

OTHER PUBLICATIONS

Andor, Pulsed Laser Deposition web pages, Jan. 14, 2013.
Uchino, "Recent Developments in Ceramic Actuators," SPIE, vol. 3321, pp. 46-57, 1998.
Verardi et al., "Influence of PZT template layer on pulsed laser deposited Pb(Mg1/3Nb2/3)O3 thin films," Applied Surface Science, 168:340-44, 2000.
Wang et al., "Composition control and electrical properties of PMN-PT thin films around the morphotropic boundary," Appl. Phys. A, 79:551-56, 2004.
Wu et al., "Domain engineered switchable strain states in ferroelectric (011) [Pb(Mg1/3Nb2/3)O3](1-x)-[PbTiO3]x(PMN-PT, x~0.32) single crystals," Journal of Applied Physics, 109:124101, 2011.
Zaman et al., "Influence of Zirconium Substitution on Dielectric, Ferroelectric and Field-induced Strain Behaviors of Lead-free 0.99[Bi1/2(Na0.82K0.18)1/2(Ti1-xZrx)O3]-0.01 LiSbO3 Ceramics," Journal of the Korean Physical Society, 61:773-78, 2012.
Singh and Pandey, "Evidence for $M_B$ and $M_C$ phases in the morphotropic phase boundary region of $(1-x)[Pb(Mg_{1/3}Nb_{2/3})O_3]$ $xPbTiO_3$: A Rietveld study," *Physical Review B*, 67:1-20, 2008.
Examination Report from Taiwan Intellectual Property Office for Taiwanese Patent Application No. 102145092 dated May 27, 2015.

* cited by examiner

CIRCUIT ELEMENT INCLUDING A LAYER OF A STRESS-CREATING MATERIAL PROVIDING A VARIABLE STRESS AND METHOD FOR THE FORMATION THEREOF

BACKGROUND OF THE INVENTION

1. Field of the Invention

Generally, the present disclosure relates to the field of integrated circuits, and, more particularly, to integrated circuits including transistors and/or other circuit elements including a stress-creating material.

2. Description of the Related Art

Integrated circuits include a large number of circuit elements which include, in particular, field effect transistors. In a field effect transistor, a gate electrode may be separated from a channel region by a gate insulation layer that provides an electrical insulation between the gate electrode and the channel region. Adjacent the channel region, a source region and a drain region are formed.

The channel region, the source region and the drain region may be formed in a semiconductor material, wherein the doping of the channel region is different from the doping of the source region and the drain region. Thus, there is a transition between differently doped semiconductor materials, for example, a PN transition, or a transition between P- or N-doped semiconductor material and substantially undoped semiconductor material, between the source region and the channel region, and between the channel region and the drain region.

In N-type transistors, the source and drain regions are doped with an N-type dopant, and the channel region may be P-doped or substantially undoped. In P-type transistors, the source and drain regions are P-doped, and the channel region may be N-doped or substantially undoped.

Depending on an electric voltage applied between the gate electrode and the source region, the field effect transistor can be switched between an on-state, wherein there is a relatively high electrical conductance between the source region and the drain region, and an off-state, wherein there is a relatively low electrical conductance between the source region and the drain region. The conductance of the channel region in the on-state of the field effect transistor may depend on the dopant concentration in the channel region, the mobility of charge carriers in the channel region, the extension of the channel region in the width direction of the transistor and on the distance between the source region and the drain region, which is commonly denoted as "channel length."

For increasing the conductance of the channel region in the on-state of the transistor, it has been proposed to improve the mobility of charge carriers in the channel region by modifying the lattice structure of the semiconductor material wherein the channel region is formed. This may be done by creating a tensile or compressive stress in the channel region. A compressive stress in the channel region can increase the mobility of holes, leading to an increase of the conductivity of the channel region of P-type transistors. Conversely, a tensile stress in the channel region can increase the mobility of electrons, which can improve the conductivity of the channel region of N-type transistors.

For providing the stress in the channel region, a material layer having an intrinsic stress may be formed over the transistor. The material layer may include, for example, silicon nitride, and may be formed, for example, by means of a plasma enhanced chemical vapor deposition process. Depending on the parameters of the plasma enhanced chemical vapor deposition process, such as, for example, composition, pressure and/or temperature of a reactant gas, a power of a radio frequency electric discharge created in the reactant gas and/or a bias voltage applied to a substrate on which the transistor is provided, a tensile or compressive intrinsic stress of the material layer may be provided. Moreover, a strength of the tensile or compressive intrinsic stress may be controlled by varying the parameters of the plasma enhanced deposition process.

However, the stress in the channel region of the transistor created by conventional material layers having an intrinsic stress typically is substantially constant after the deposition of the material layer and cannot be adjusted afterwards. Therefore, the performance of the transistor, in particular, the electrical conductance of the channel region in the on-state of the transistor, which is linked to the stress in the channel region provided by the intrinsically stressed material layer, is substantially constant as well.

In view of the situation described above, the present disclosure provides techniques that allow providing a stress in a channel region of a transistor that can be modified after the manufacturing of the transistor.

The present disclosure further provides techniques that allow varying the resistance of a semiconductor region in a circuit element other than a transistor by modifying a stress in the semiconductor region.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative circuit element as disclosed herein includes a semiconductor region and a layer of a stress-creating material. The stress-creating material provides a stress that is variable in response to a signal acting on the stress-creating material. The layer of stress-creating material is arranged to provide a stress in the semiconductor region. The stress provided in the semiconductor region is variable in response to the signal acting on the stress-creating material.

An illustrative circuit disclosed herein includes a current mirror circuit and a calibration circuit. The current mirror circuit includes a first transistor in an input current path of the current mirror circuit and a second transistor in an output current path of the current mirror circuit. Each of the first and the second transistors includes a source region, a drain region, a channel region and a gate electrode. At least one of the first transistor and the second transistor includes a layer of a stress-creating material. The stress-creating material provides a stress that is variable in response to a signal acting on the stress-creating material. The stress-creating material has a stress hysteresis wherein at least a portion of the stress provided in response to the signal is maintained after removal of the signal. The layer of stress-creating material is arranged to provide a stress in at least the channel region of the transistor wherein it is provided, the stress being variable in response to the signal acting on the stress-creating material. The calibration circuit is adapted for calibrating the current mirror circuit. The calibration includes detecting a current difference between a current flowing through the input current path and a ratio between a current flowing through the output current path and a multiplication factor and applying a signal to the stress-creating material in the at least one of the first transistor and the second transistor in response to the detected current difference, the application of the signal reducing the current difference.

An illustrative sensor disclosed herein includes a transistor and a circuit. The transistor includes a source region, a drain region, a channel region, a gate electrode and a layer of a stress-creating material. The stress-creating material provides a stress that is variable in response to an external influence acting on the stress-creating material and is arranged to provide a stress in at least the channel region of the transistor. The stress provided in at least the channel region of the transistor is variable in response to the external influence acting on the stress-creating material. The circuit applies a first voltage between the gate electrode and the source region, applies a second voltage between the source region and the drain region, and measures a current flowing between the source region and the drain region in response to the first and the second voltage.

An illustrative inverter disclosed herein includes a pull-up transistor, a pull-down transistor and an input terminal. The pull-up transistor and the pull-down transistor are electrically connected in series between a high voltage power supply terminal and a low voltage power supply terminal. The input terminal is electrically connected to the pull-up transistor and the pull-down transistor. The pull-up transistor is switchable to an off-state by applying a high voltage to the input terminal and to an on-state by applying a low voltage to the input terminal. The pull-down transistor is switchable to an on-state by applying a high voltage to the input terminal and to an off-state by applying a low voltage to the input terminal. The pull-up transistor includes a first layer of stress-creating material providing a variable stress in the channel region of the pull-up transistor that is variable in response to a voltage applied to the input terminal. The variable stress is adapted to increase a mobility of charge carriers in the channel region of the pull-up transistor obtained in the on-state of the pull-up transistor compared to a mobility of charge carriers in the channel region of the pull-up transistor obtained in the off-state of the pull-up transistor.

The pull-down transistor includes a second layer of a stress-creating material providing a stress in the channel region of the pull-down transistor that is variable in response to the voltage applied to the input terminal. The variable stress is adapted to increase a mobility of charge carriers in the channel region of the pull-down transistor obtained in the on-state of the pull-down transistor compared to a mobility of charge carriers in the channel region of the pull-down transistor obtained in the off-state of the pull-down transistor.

An illustrative memory cell disclosed herein includes a first transistor, a read terminal and a write terminal. The first transistor includes a source region, a drain region, a channel region, a gate electrode and a layer of stress-creating material. The stress-creating material provides a stress in the channel region that is variable in response to an electric field applied to the layer of stress-creating material. The stress-creating material has a stress hysteresis, wherein at least a portion of the stress provided in response to the electric field is maintained after removal of the electric field. The first transistor further comprises at least one stress-control electrode that is provided adjacent the layer of stress-creating material. The read terminal is electrically connected to the gate electrode of the first transistor. The write terminal is electrically connected to one of the at least one stress-control electrode of the first transistor.

An illustrative method disclosed herein includes providing a substrate including a semiconductor material. A gate insulation layer and a gate electrode are formed over the semiconductor material. A source region and a drain region are formed in the semiconductor material adjacent the gate electrode. A portion of the semiconductor material below the gate electrode provides a channel region. A layer of a stress-creating material is formed over the source region, the drain region and the gate electrode. The stress-creating material provides a stress in a channel region that is variable in response to a signal acting on the stress-creating material.

BRIEF DESCRIPTION OF THE DRAWINGS

The disclosure may be understood by reference to the following description taken in conjunction with the accompanying drawings, in which like reference numerals identify like elements, and in which.

Figure 1A:
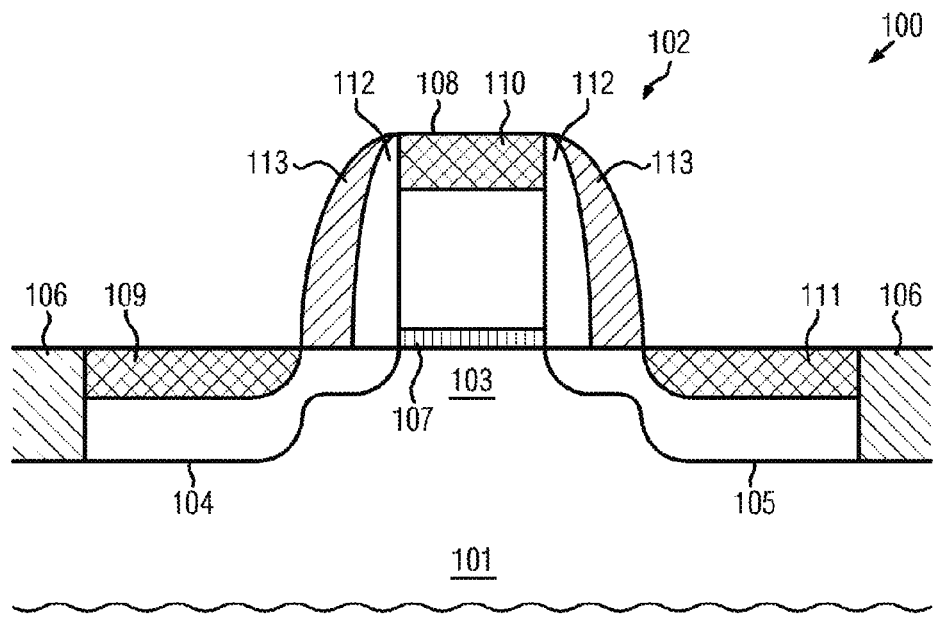
FIGS. 1a-1e show schematic cross-sectional views of a semiconductor structure according to an embodiment in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides transistors wherein a layer of a stress-creating material that provides a stress that is variable in response to a signal acting on the stress-creating material is provided. The layer of stress-creating material may be arranged to provide a stress in at least the channel region and, optionally, also in the source region and/or the drain region of the transistor. The stress provided by the layer of stress-creating material is variable in response to the signal acting on the stress-creating material. In some embodiments, the stress-creating material may include a piezoelectric material and/or an electrostrictive material, wherein the stress provided by the stress-creating material may be modified by means of an electric field. In further embodiments, the stress-creating material may include a current-strictive material, wherein the stress may be modified by means of an electric current flowing through the stress-creating material, or a magnetostrictive material, wherein the stress may be modified by means of a magnetic field.

Since the mobility of charge carriers in the channel region of the transistor and, accordingly, the conductance of the channel region obtained in the on-state of the transistor may be influenced by a stress of the semiconductor material in the channel region of the transistor, a stress-creating material as described above providing a stress that is variable in response to a signal acting on the stress-creating material may allow tuning the performance of transistors after final processing.

This may provide, for example, the opportunity to improve transistor matching and, thus, the opportunity to save layout space and increase design freedom, as high precision matching transistors usually require rigorous layout rules. Since a modification of the performance can, in particular, result in a modification of the output current, it can also be used as an additional input to modify the electrical behavior of the transistor (in addition to voltages applied to the source region, the drain region, the gate electrode and the substrate on which the transistor is formed), or for memory applications, which can, in particular, include nonvolatile memory implementations.

In some embodiments, the stress-creating material may change stress depending on a trigger signal and return to a previous value of the stress when the signal is removed, so that there is substantially no stress hysteresis or only a small amount of stress hysteresis. Thus, the electrical conductivity of the channel region in the on-state of the transistor may be controlled in accordance with the signal applied to the stress-creating material. In other embodiments, the stress-creating material may have a stress hysteresis and stay at a modified stress value when the trigger signal is removed. Thus, the conductivity of the channel region in the on-state of the transistor may be switched by applying a signal to the stress-creating material.

The present disclosure is not limited to embodiments wherein a stress that is variable in response to a signal acting on a layer of stress-creating material is provided in a channel region of a transistor. In other embodiments, a stress that is variable in response to a signal acting on a layer of stress-creating material may be provided in a semiconductor region of a circuit element other than a transistor, for example, a semiconductor region provided in a resistor. The variable stress may modify the mobility of electrons and/or holes in the semiconductor region, so that a substantially ohmic resistance of the semiconductor region is variable in response to a signal acting on the layer of stress-creating material.

In such embodiments, the stress-creating material may have a stress hysteresis, so that the variation of the ohmic resistance induced by the signal may be maintained at least partially after removal of the signal. In other embodiments, a stress-creating material having substantially no stress hysteresis or only a small stress hysteresis may be used for providing an ohmic resistance that is dynamically controllable by the signal applied to the layer of stress-creating material.

The use of such resistors instead of field effect transistors may be useful in applications where low noise and/or high signal-to-noise ratios at low frequencies are required, since they may be less susceptible to flicker noise (1/f noise).

FIG. 1a shows a schematic cross-sectional view of a semiconductor structure 100 including a field effect transistor 102 in a stage of a method of manufacturing the field effect transistor 102.

The semiconductor structure 100 includes a substrate 101, wherein a source region 104, a channel region 103 and a drain region 105 of the transistor 102 are formed. A trench isolation structure 106, which may be a shallow trench isolation structure, may provide electrical insulation between the transistor 102 and other circuit elements in the semiconductor structure 100 (not shown).

A gate electrode 108 is provided above the substrate 101 and electrically insulated from the substrate 101 by a gate insulation layer 107 that is provided between the channel region 103 and the gate electrode 108. The channel region 103 is provided below the gate electrode 108 and between the source region 104 and the drain region 105.

The source region 104, the drain region 105 and the gate electrode 108 may include silicide portions 109, 111, 110, respectively. Adjacent the gate electrode 108, a sidewall spacer 112 formed of, for example, silicon dioxide and a sidewall spacer 113 formed of a different material than the sidewall spacer 112, for example, silicon nitride, may be provided. In some embodiments, liner layers (not shown) may be provided between the sidewall spacer 112 and the gate electrode 108, and between the sidewall spacer 113 and the sidewall spacer 112.

The semiconductor structure 100 as shown in FIG. 1a may be formed by means of known manufacturing processes which may, in particular, include known techniques of deposition, photolithography, etching and/or oxidation for forming the trench isolation structure 106, the gate insulation layer 107 and the gate electrode 108. Furthermore, ion implantation processes may be performed for introducing dopant materials into the channel region 103, the source region 104 and the drain region 105, so that the doping of the source region 104 and the drain region 105 is different from the doping of the channel region 103. Absorption of ions by the sidewall spacer 112 and/or the sidewall spacer 113 may be used for providing desired dopant profiles in the source region 104 and the drain region 105. The dopant profiles may, in particular, include a source extension region and a drain extension region, which are provided adjacent the channel region 103 and have a shallower depth than the rest of the source region 104 and the drain region 105, respectively, as shown in FIG. 1a.

The silicide portions 109, 110, 111 in the source region 104, the gate electrode 108 and the drain region 105 may improve the electrical conductivities of the source region 104, the gate electrode 108 and the drain region 105, respectively. The silicide portions 109, 110, 111 may be formed by depositing a metal layer, for example a layer of nickel, platinum and/or tungsten, over the semiconductor structure 100 and initiating a chemical reaction between the metal and the semiconductor material in the source region 104, the gate electrode 108 and the drain region 105, for example by thermal activation. Unreacted metal may be removed by means of an etch process.

The present disclosure is not limited to embodiments wherein the source region 104, the channel region 103 and the drain region 105 are formed in a bulk semiconductor substrate 101, as shown in FIG. 1a. In other embodiments, a semiconductor-on-insulator (SOI) configuration may be employed, wherein the source region 104, the channel region 103 and the drain region 105 are formed in a semiconductor layer that is separated from a substrate wafer by a layer of an electrically insulating material which may, for example, include silicon dioxide.

Figure 1B:
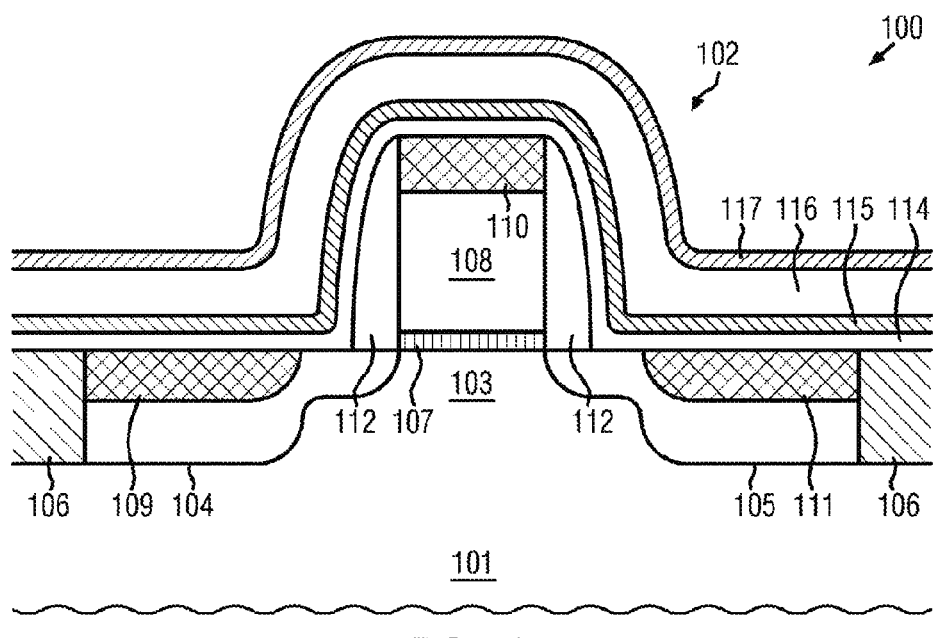

FIG. 1b shows a schematic cross-sectional view of the semiconductor structure 100 in a later stage of the manufacturing process. After the formation of the source region 104, the drain region 105 and the silicide portions 109, 110, 111, the sidewall spacer 113 may be selectively removed. In some embodiments, this may be done by means of a reactive ion etch (RIE) process adapted for selectively etching the material of the sidewall spacer 113 relative to the material of the sidewall spacer 112. In the selective etching of a first material relative to a second material, an etch rate of the first material is greater than an etch rate of the second material, so that the first material is more quickly removed than the second material.

Reactive ion etching is a dry etch process, wherein ions and radicals are provided by an electric glow discharge that is created in a reactant gas. On the surface of the semiconductor structure 100, chemical reactions between materials of the semiconductor structure 100 and the ions and/or radicals may occur. Additionally, the surface of the semiconductor structure 100 may be bombarded with energetic ions, which may cause a sputtering of the surface. Due to the chemical reactions, and due to the sputtering, material may be removed from the surface of the semiconductor structure 100.

The selectivity of the reactive ion etch process may be obtained by an appropriate selection of the reactant gas and by an adaptation of parameters, such as the pressure of the reactant gas and the power of the electric discharge. For selectively removing the sidewall spacer 113, the reactive ion etch process may be adapted such that the material of the sidewall spacer 113, which may, for example, be silicon nitride, is removed at a greater etch rate than other materials of the semiconductor structure 100.

The present disclosure is not limited to embodiments wherein the sidewall spacer 113 is completely removed, as shown in FIG. 1b. In other embodiments, the size of the sidewall spacer 113 may be reduced, and portions of the sidewall spacer 113 may remain on the semiconductor structure 100. In further embodiments, the sidewall spacer 113 may remain in the semiconductor structure 100.

Removing the sidewall spacer 113 completely or partially, as described above, may help to provide a smaller distance between a layer of stress-creating material whose formation will be described below, and the channel region 103, which may help to more efficiently provide a stress created by the layer of stress-creating material in the channel region 103.

An electrically insulating layer 114 may be formed over the semiconductor structure 100. The electrically insulating layer 114 may include a dielectric material such as, for example, silicon dioxide, silicon oxynitride and/or silicon nitride, and may be formed by means of deposition techniques such as chemical vapor deposition and/or plasma enhanced chemical vapor deposition.

A bottom stress-control electrode 115 may be formed on the electrically insulating layer 114. The bottom stress-control electrode 115 may include an electrically conductive material, for example, titanium nitride (TiN) or a metal such as tungsten (W), gold (Au), chromium (Cr), aluminum (Al). Methods for forming the bottom stress-control electrode 115 when including a metal may include techniques of physical vapor deposition, such as sputtering or pulsed laser deposition, and/or chemical deposition techniques, such as chemical vapor deposition and/or plasma-enhanced chemical vapor deposition.

In other embodiments, the bottom stress-control electrode 115 may include an electrically conductive oxide, such as lanthanum strontium cobalt oxide ($La_{0.5}Sr_{0.5}CoO_3$), abbreviated as LSCO. In such embodiments, the bottom stress-control electrode 115 may be formed by means of pulsed laser deposition, for example at a temperature of 575° C., under 150 mTorr of oxygen partial pressure at a laser fluence of about 2 $J/cm^2$, as disclosed, for example, in Wang et. al., "Composition control and electrical properties of PMN-PT thin films around the morphotropic boundary," *Applied Physics A—Materials Science & Processing*, 79:551-56 (2004), the disclosure of which is incorporated herein by reference.

In further embodiments, the bottom stress-control electrode 115 may include a silicide. In such embodiments, the formation of the bottom stress-control electrode 115 may include depositing a layer of polysilicon by means of chemical vapor deposition and/or plasma enhanced chemical vapor deposition and depositing a layer of a metal, for example, nickel, platinum and/or tungsten, on the polysilicon layer, for example by means of sputtering, and initiating a chemical reaction between the metal and the polysilicon, for example by means of an annealing process. Thereafter, unreacted metal may be removed by means of an etch process.

A layer 116 of a stress-creating material may be deposited over the bottom stress-control electrode 115. The stress-creating material 116 provides a stress that is variable in response to a signal acting on the stress-creating material.

The stress-creating material 116 may include an electrostrictive material. When a signal provided in the form of an electric field acts on an electrostrictive material, a deformation of the electrostrictive material that depends on the strength of the electric field may be obtained. The deformation may be associated with a stress in the layer 116 of stress-creating material, which may be approximately proportional to a square of the strength of the electric field. In some embodiments wherein the layer 116 of stress-creating material includes an electrostrictive material, the layer 116 of stress-creating material may include a lead magnesium niobate ($Pb(Mg_{1/3}Nb_{2/3})O_3$), abbreviated as PMN, based ceramic material. PMN may have a relatively small stress hysteresis or substantially no stress hysteresis (see, for example, Uchino, "Recent developments in Ceramic Actuators," 1996 *Symposium on Smart Materials, Structures and MEMS*, SPIE Vol. 3321 (1998), the disclosure of which is incorporated herein by reference). Methods of forming the layer 116 of stress-creating material when including PMN may include pulsed laser deposition.

In some embodiments, the pulsed laser deposition of PMN may be performed as disclosed in Verardi et. al., "Influence of PZT template layer on pulsed laser deposited $Pb(Mg_{1/3}Nb_{2/3})O_3$ thin films," *Applied Surface Science*, 168:340-44 (2000), the disclosure of which is incorporated herein by reference. In particular, the pulsed laser deposition process may be performed at a temperature of about 500° C. in an ambient comprising oxygen at a pressure of about 0.2 mbar at a laser fluence of about 25 J/cm² for a time of about 90 min. Thereafter, the semiconductor structure may be cooled down under an oxygen pressure of about 800 mbar. The laser may be a Nd-YAG laser operating at 1064 nm with a repetition rate of about 10 Hz. In some embodiments, a template layer comprising $Pb(Zr_xTi_{1-x})O_3$ (PZT), where x may be about 0.53 may be provided below the PNM layer. The deposition of PTZ may be performed for about 40 min at a temperature of about 400° C. at an oxygen pressure of about 0.2 mbar. Thereafter, a cooling at an oxygen pressure of about 0.2 mbar may be performed.

In other embodiments, other parameters of the deposition process may be used, and suitable parameters may be determined by means of routine experiments. Moreover, the PZT template layer may be omitted.

In further embodiments, the layer 116 of stress-creating material may include a piezoelectric material. When a signal provided in the form of an electric field is applied to a piezoelectric material, a deformation and/or a stress of the piezoelectric material may be obtained due to the inverse piezoelectric effect. The stress obtained by the inverse piezoelectric effect may be approximately proportional to the strength of the electric field applied to the piezoelectric material. Examples of piezoelectric materials may include piezoceramic material, such as lead zirconate titanate, PZT, ($Pb(Zr_xTi_{1-x})O_3$, wherein x may be in a range from about 0 to about 1, in particular in the range from about 0.4 to about 0.6, for example about 0.5) or lanthanum doped lead zirconate titanate (PLZT) compounds such as, for example, $Pb_{0.83}La_{0.17}(Zr_{0.3}Ti_{0.7})_{0.9575}O_3$ (PLZT 17/30/70). Methods for forming the layer 116 of stress-creating material when including PZT or PLZT may include pulsed laser deposition. In some embodiments, parameters of the pulsed laser deposition process may correspond to those employed in the formation of the PZT template layer described above.

In further embodiments, the layer 116 of stress-creating material may include a material having a stress hysteresis, wherein at least a portion of the stress provided in response to the signal, which may be provided in form of an electric field, is maintained after removal of the signal. In such embodiments, the stress-creating material of the layer 116 may include a relaxor ferroelectric, for example $[Pb(Zn_{1/3}Nb_{2/3})O_3]_{(1-x)}$—$[PbTiO_3]_x$, wherein x may be greater than 0 and less than about 0.1 (PZN-PT) and/or $[Pb(Mg_{1/3}Nb_{2/3})O_3]_{(1-x)}$—$[PbTiO_3]_x$, wherein x may be greater than 0 and less than about 0.5, in particular greater than 0.3 and less than about 0.4, for example about 0.32, about 0.35 or about 0.4 (PMN-PT).

In embodiments wherein the layer 116 of stress-creating material includes PMN-PT, formation of the layer 116 of stress-creating material may include a pulsed laser deposition process, for example, a pulsed laser deposition process as described in Wang et al., "Composition control and electrical properties of PMN-PT thin films around the morphotropic boundary," *Applied Physics A—Materials Science & Processing*, 79:55156 (2004), the disclosure of which is incorporated herein by reference.

In particular, in embodiments wherein the layer 116 of stress-creating material includes PMN-PT, a PMN-PT target may be fabricated, wherein the parameter x defining the amount of $PbTiO_3$ as compared to the amount of $Pb(Mg_{1/3}Nb_{2/3})O_3$ is selected in accordance with the desired composition of the layer 116 of stress created material, and wherein excessive amounts of Pb and Mg may be provided in order to take losses caused by re-evaporation during the pulsed laser deposition process into account. For example, a 40 percent (atomic) excessive amount of Pb and a 35 percent (atomic) excess of Mg may be provided.

Using the above-described PMN-PT target, a pulsed laser deposition process may be performed. The pulsed laser deposition process may be performed at a temperature in a range from about 550-650° C., for example at a temperature of about 600° C., in an oxygen ambient having a pressure of about 200 mTorr. A laser fluence in a range from about 1.5-2.5 J/cm², for example a laser fluence of about 2 J/cm², may be employed. The deposition time may be about 20 minutes for a 500 nm thick PMN-PT layer, and shorter or longer deposition times may be employed when a smaller or greater thickness of the layer 116 of stress-creating material is to be provided.

After the deposition of the layer 116 of stress-creating material, a post annealing may be carried out, wherein the temperature may be reduced to a temperature in a range from about 450-550° C., for example about 500° C., while the oxygen pressure is increased to about 1 bar.

In other embodiments, different parameters of the deposition process may be employed, wherein suitable values of the parameters may be determined by means of routine experimentation.

Similar deposition processes may be used for forming the layer 116 of stress-creating material when including other materials, such as, for example, PZN-PT.

In further embodiments, the layer 116 of stress-creating material may comprise a current-strictive material providing a stress that depends on an amperage of a current flowing through the layer 116, for example may-valley semiconductors such as germanium.

After the formation of the layer 116 of stress-creating material, a top stress-control electrode 117 may be formed. Materials of the top stress-control electrode 117, and techniques employed in the formation of the top stress-control electrode 117, may include the materials and techniques used for the bottom stress-control electrode 115. The material of the top stress-control electrode 117 need not be identical to the material of the bottom stress electrode 115. For example, in one embodiment, the bottom stress-control electrode 115 may include lanthanum strontium cobalt oxide, and the top stress-control electrode 117 may include tungsten, titanium nitride, gold and/or chromium. In other embodiments, both the top stress-control electrode 117 and the bottom stress-control electrode 115 may include titanium nitride, a metal, for example tungsten, or any of the other metals mentioned above, or a silicide as described above, wherein the top stress-control electrode 117 may be formed of substantially the same material as the bottom stress-control electrode 115.

Figure 1C:
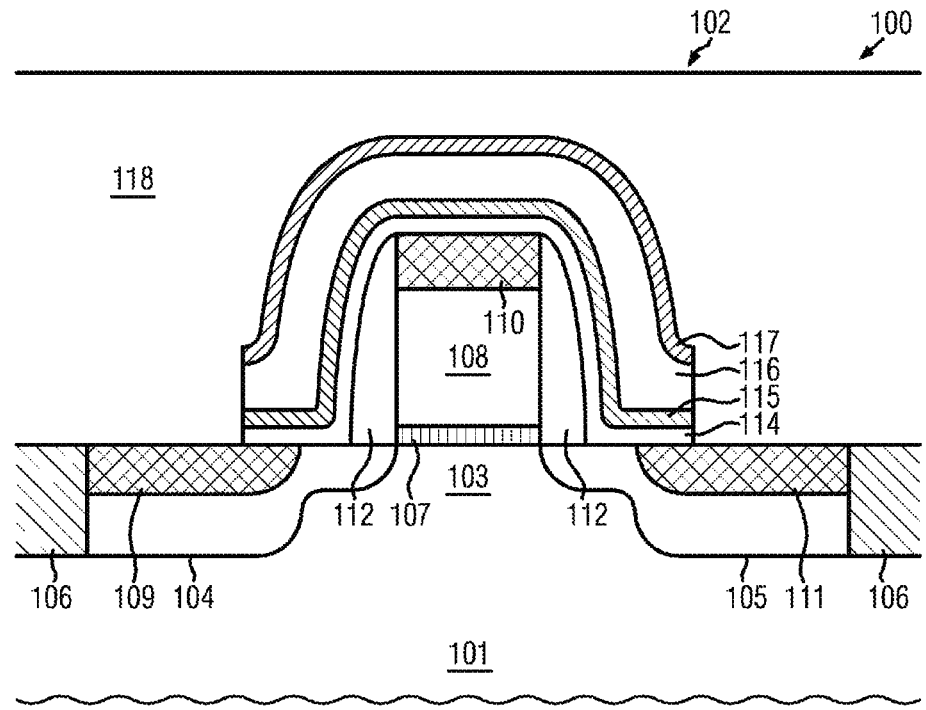

FIG. 1c shows a schematic cross-sectional view of the semiconductor structure 100 in a later stage of the manufacturing process. After the formation of the top stress-control electrode 117, an etch process may be performed for removing portions of the bottom stress-control electrode 115, the layer 116 of stress-creating material and the top stress-control electrode 117. Optionally, portions of the electrically insulating layer 114 may also be removed.

In the etch process, portions of the bottom stress-control electrode 115, the layer 116 of stress-creating material and the top stress-control electrode 117 and, optionally, the electrically insulating layer 114, above a portion of the source region 104, a portion of the drain region 105 and/or the trench isolation structure 106 may be removed to expose portions of the source region 104 and the drain region 105, in particular portions of the silicide portions 109, 111 in the source region 104 and the drain region 105, respectively. Portions of the electrically insulating layer 114, the bottom stress-control electrode 115, the layer 116 of stress-creating material and the top stress-control electrode 117 adjacent the gate electrode 108 and above the gate electrode 108 may remain in the semiconductor structure 100.

For removing the portions of the bottom stress-control electrode 115, the layer 116 of stress-creating material, the top stress-control electrode 117 and, optionally, the electrically insulating layer 114, techniques of photolithography and etching may be employed. In particular, a mask covering portions of the semiconductor structure 100 with the exception of those portions from which the bottom stress-control electrode 115, the layer 116 of stress-creating material, the top stress-control electrode 117 and, optionally, the electrically insulating layer 114 are to be removed may be formed by means of photolithography. Thereafter, an etch process, for example a dry etch process and/or a reactive ion etch process, may be performed for removing those portions of the electrically insulating layer 114, the bottom stress-control electrode 115, the layer 116 of stress-creating material and the top stress-control electrode 117 which are not covered by the mask. In some embodiments, the etch process may be a deep reactive ion etch process using an inductively coupled plasma reactive ion etch system as described in Agnus et. al., "Dry Etching of Single Crystal PMN-PT Piezoelectric Material," published in 24$^{th}$ International Conference on Micro Electro Mechanical Systems, MEMS'11, Cancun, Mexico, 2011, the disclosure of which is incorporated herein by reference. In particular, a mask comprising nickel on a chromium buffer may be used. The etch process may be performed in an etch gas comprising Ar (about 92%) and $C_4F_8$ (about 8%) at a temperature in a range from about −20° C. to about 60° C., a bias power in a range from about 100-500 W, an RF source power in a range from about 500-1200 W and a pressure in a range from about 2-15 mTorr. The duration of the etch process may be selected in accordance with the thickness of the material to be removed. In other embodiments, other parameters of the etch process may be used, and suitable parameters may be determined by means of routine experiments.

Thereafter, a dielectric material 118 may be deposited over the semiconductor structure 100, and a planarization process may be performed for obtaining a substantially planar surface of the dielectric material 118.

The dielectric material 118 may include silicon dioxide, silicon oxynitride and/or silicon nitride and may be deposited by means of techniques of chemical vapor deposition and/or plasma enhanced chemical vapor deposition. The planarization of the dielectric material 118 may include chemical mechanical polishing, wherein the semiconductor structure 100 is moved relative to a polishing pad, and a slurry is applied to an interface between the semiconductor structure 100 and the polishing pad. Portions of the dielectric material 118 may be removed due to chemical reactions between the slurry and the dielectric material 118 and/or by mechanical abrasion.

Figure 1D:
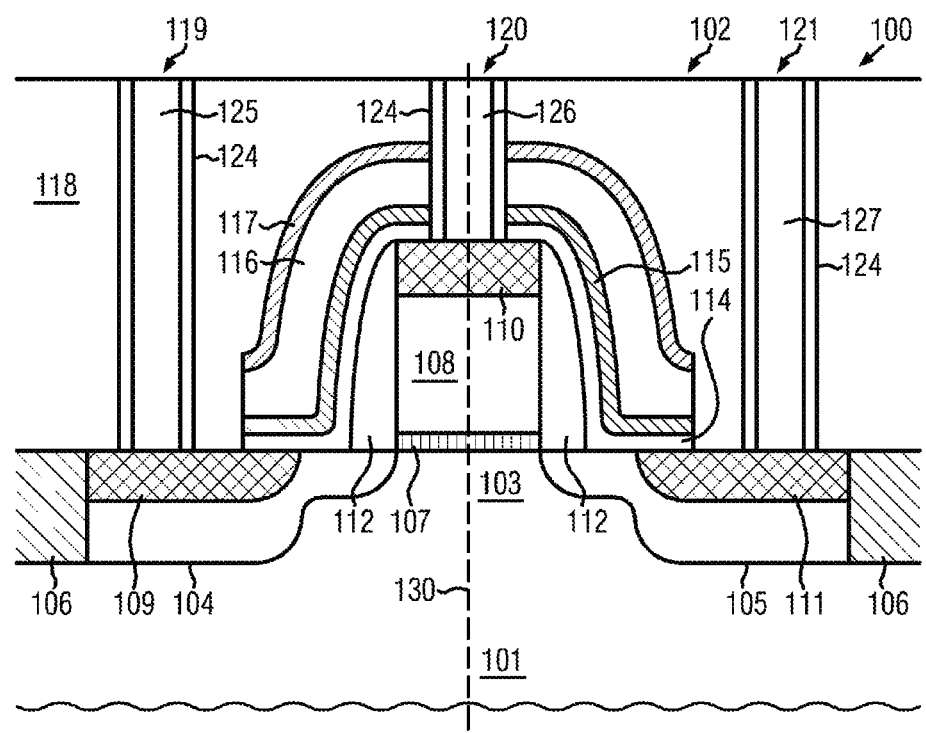
Figure 1E:
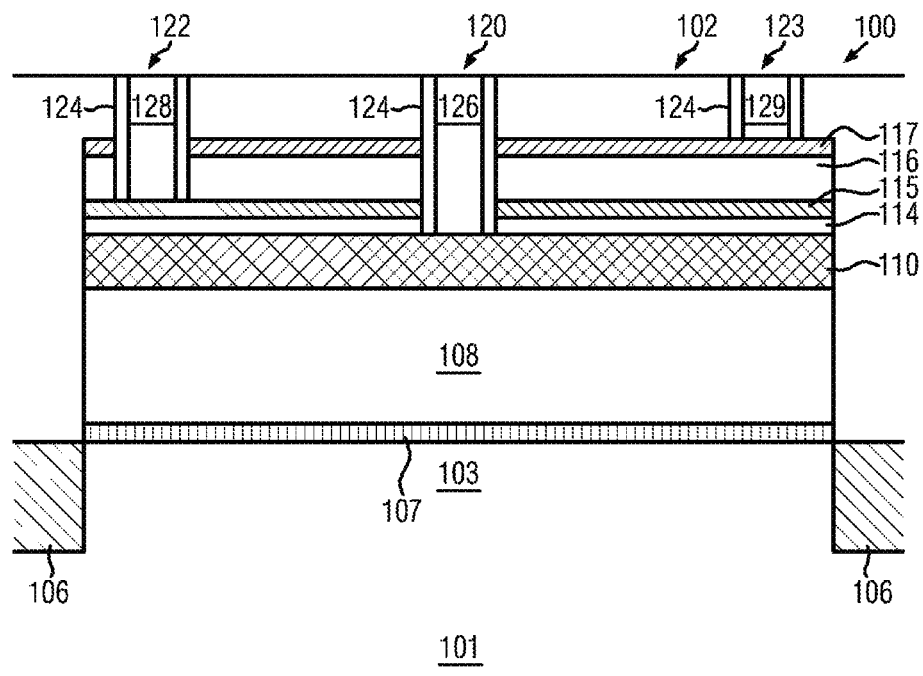

FIGS. 1d and 1e show schematic cross-sectional views of the semiconductor structure 100 in a later stage of the manufacturing process. FIG. 1d shows a cross-section along the same plane as FIGS. 1a-1c, and FIG. 1e shows a cross-section along a plane that is perpendicular to the plane of drawing of FIG. 1d and runs through the line 130 shown in FIG. 1d. Hence, FIG. 1d shows a cross-section along the length direction of the transistor 102, and FIG. 1e shows a cross-section along the width direction of the transistor 102 through the center of the gate electrode 108.

A source contact via 119, a gate contact via 120, a drain contact via 121 and stress-control contact vias 122, 123 may be formed in the dielectric material 118. Contact vias 119, 120, 121, 122, 123 may be formed by means of known techniques for forming contact vias in a dielectric material, including photolithography and an anisotropic dry etch process.

The source contact via 119 extends through the dielectric material 118 to the silicide portion 109 in the source region 104. The gate contact via 120 extends through the dielectric material 118, the top stress-control electrode 117, the layer 116 of stress-creating material, the bottom stress-control electrode 115 and the electrically insulating layer 114 to the silicide portion 110 in the gate electrode 108. The drain contact via 121 extends through the dielectric material 118 to the silicide portion 111 in the drain region 105. The stress-control contact via 122 extends through the dielectric material 118, the top stress-control electrode 117 and the layer 116 of stress-creating material to the bottom stress-control electrode 115. The stress-control contact via 123 extends through the dielectric material 118 to the top stress-control electrode 117.

After the formation of the contact vias 119 to 123, a liner layer 124 may be formed at the sidewalls of the contact vias 119 to 123. The liner layer 124 may include an electrically insulating material, for example silicon dioxide, silicon oxynitride and/or silicon nitride, and may be formed by substantially isotropically depositing the material of the liner layer 124 over the semiconductor structure 100 and performing an anisotropic etch process for substantially removing portions of the liner layer 124 from the bottom of the contact vias 119 to 123 and, optionally, the top surface of the dielectric material 118.

The liner layer 124 may help to prevent an electric contact between a gate contact 126 formed in the gate contact via 120 and the stress-control electrodes 115, 117 and may help to prevent an electric contact between a stress-control contact 128 formed in the stress-control contact via 122 and the top stress-control electrode 117. The formation of the gate contact 126, the stress-control contact 128 and further contacts will be described in the following.

After the formation of the liner layer 124, the contact vias 119 to 123 may be filled with an electrically conductive material, for example, a metal such as tungsten. For this purpose, the electrically conductive material may be deposited by means of known deposition techniques, and portions of the electrically conductive material outside the contact vias 119 to 123 may be removed, for example, by means of a chemical mechanical polishing process.

The electrically conductive material in the source contact via 119 provides a source contact 125 for electrically connecting the source region 104 with other circuit elements in the semiconductor structure 100. The electrically conductive material in the gate contact via 120 provides the gate contact 126 for electrically connecting the gate electrode 108 with other circuit elements in the semiconductor structure 100, and the electrically conductive material in the drain contact via 121 provides a drain contact 127 for electrically connecting the drain region 105 with other circuit elements in the semiconductor structure 100.

The electrically conductive material in the stress-control contact via 122 provides the stress-control contact 128 for electrically connecting the bottom stress-control electrode 115 with other circuit elements in the semiconductor structure 100. The electrically conductive material in the stress-control contact via 123 provides a stress-control contact 129 for electrically connecting the top stress-control electrode 117 with other circuit elements in the semiconductor structure 100.

Thereafter, further electrical contact layers (not shown) including interlayer dielectric materials as well as contact vias and trenches filled with an electrically conductive material may be formed for completing the semiconductor structure 100.

In some embodiments, a poling process may be performed after the completion of the semiconductor structure 100 for creating a ferroelectric polarization of the stress-creating material in the layer 116. For this purpose, an electric voltage may be applied between the stress-control contacts 128, 129. Thus, an electric field is created between the bottom stress-control electrode 115 and the top stress-control electrode 117. Due to the application of the electric field to the layer 116 of stress-creating material, the ferroelectric polarization of the stress-creating material may align to the electric field. In particular, in embodiments wherein the layer 116 of stress-creating material includes a polycrystalline ferroelectric piezoceramic material, poling the layer 116 of stress-creating material may help to obtain or increase piezoelectric properties of the layer 116 of stress-creating material.

Figure 2:
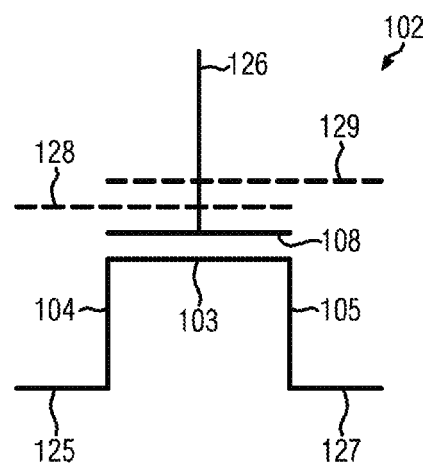
FIG. 2 shows a circuit symbol for a transistor according to an embodiment provided in the semiconductor structure of FIGS. 1a-1e.

FIG. 2 shows a circuit symbol which will be used in the following in circuit diagrams of circuits including transistors similar to the transistor 102 described above with reference to FIGS. 1a-1e.

In the circuit symbol of FIG. 2, the source contact 125, the source region 104, the channel region 103, the drain region 105, the drain contact 127, the gate electrode 108 and the gate contact 126 are shown in accordance with conventional circuit symbols for field effect transistors. Additionally, dashed lines are drawn to denote the stress-control contact 128 electrically connected to the bottom stress-control electrode 115 and the stress-control contact 129 connected to the top stress-control electrode 117.

In accordance with conventional circuit symbols for field effect transistors, arrows at the source region 104 (not shown in FIG. 2) may be used for distinguishing P-channel transistors and N-channel transistors, wherein the arrow points from the channel region 103 to the source contact 125 in N-channel transistors, and the arrow points from the source contact 125 to the channel region 103 in P-channel transistors.

Figure 3A:
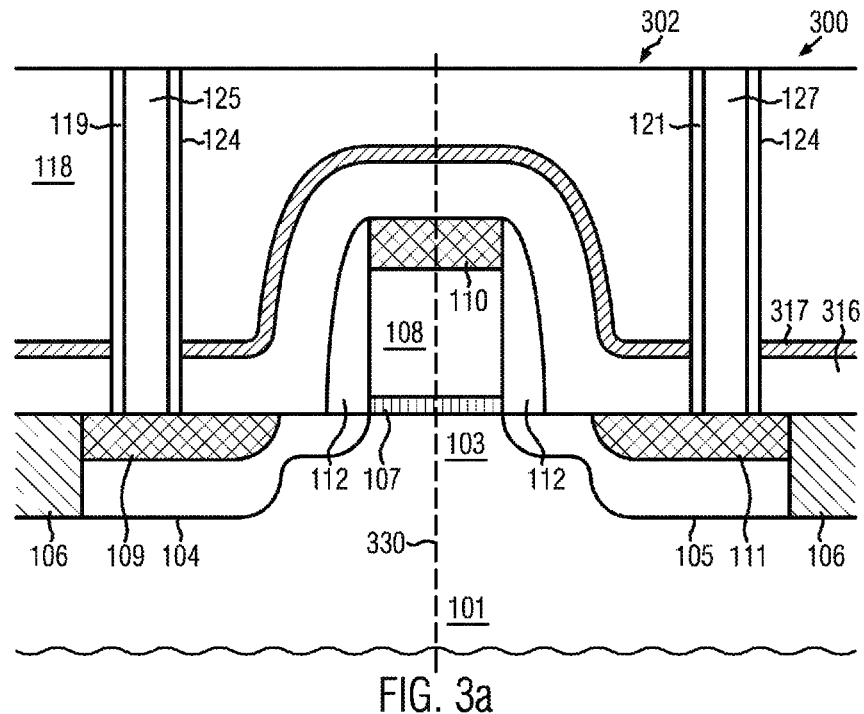
FIGS. 3a-3b show schematic cross-sectional views of a semiconductor structure according to an embodiment.
Figure 3B:
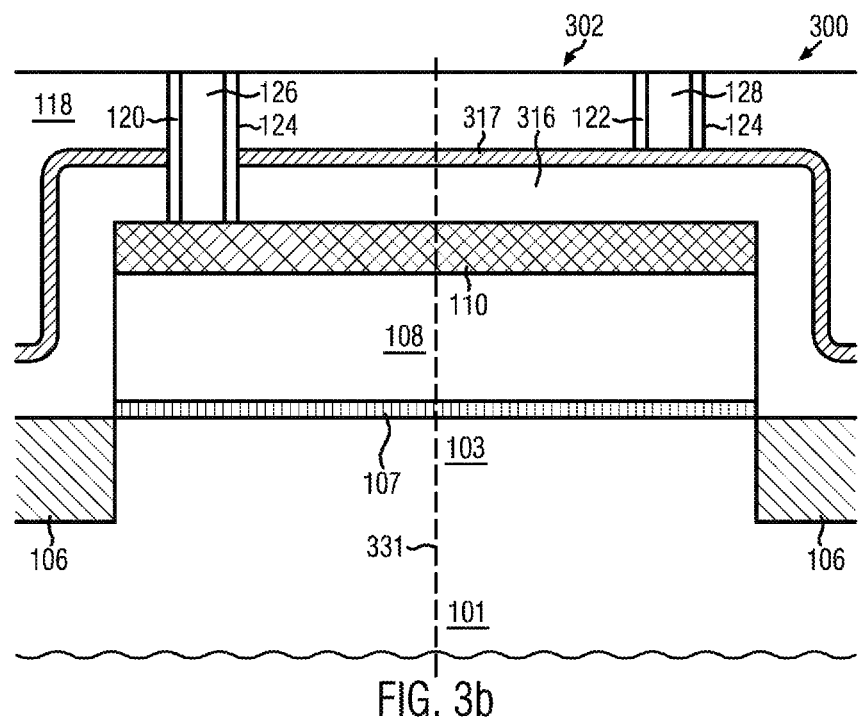

FIGS. 3a and 3b show schematic cross-sectional views of a semiconductor structure 300 according to another embodiment. FIG. 3b shows a cross-sectional view along a plane that is perpendicular to the plane of drawing of FIG. 3a and runs through the dashed line 330 shown in FIG. 3a. The cross-sectional view shown in FIG. 3a is along a plane that is perpendicular to the plane of drawing of FIG. 3b and runs through the dashed line 331 shown in FIG. 3b.

The semiconductor structure 300 includes a field effect transistor 302, wherein the cross-section shown in FIG. 3a is along the length direction of the transistor 302, and the cross-section of FIG. 3b is along the width direction of the transistor 302.

Some features of the semiconductor structure 300 may correspond to features of the semiconductor structure 100 described above with reference to FIGS. 1a-1e. For convenience, in FIGS. 3a and 3b on the one hand, and FIGS. 1a-1e on the other hand, like reference numerals have been used to denote like components, and features of components of the semiconductor structure 300 may correspond to features of components of the semiconductor structure 100 denoted by like reference numerals.

The semiconductor structure 300 includes a substrate 101 wherein a source region 104, a channel region 103 and a drain region 105 of the transistor 302 are formed. A trench isolation structure 106 provides electrical insulation between the transistor 302 and other circuit elements in the semiconductor structure 300. A gate electrode 108 is formed above the substrate 101 and electrically insulated therefrom by a gate insulation layer 107. In the source region 104, the gate electrode 108 and the drain region 105, silicide portions 109, 110, and 111, respectively, may be provided.

Adjacent the gate electrode 108, a sidewall spacer 112 may be provided. In the formation of the source region 104 and the drain region 105, an additional sidewall spacer formed of another material than the sidewall spacer 112 (not shown), similar to the sidewall spacer 113 described above with reference to FIG. 1a, may be employed. The additional sidewall spacer may later be removed, completely or partially, by means of an etch process, as described above.

A layer 316 of stress-creating material may be formed over the source region 104, the gate electrode 108 and the drain region 105. The layer 316 of stress-creating material may be formed directly on the source region 104, the gate electrode 108, the silicon dioxide sidewall spacer 112 and the drain region 105, as shown in FIG. 3a, or a relatively thin layer of an electrically insulating material (not shown) similar to the layer 114 described above may be formed below the layer 316 of stress-creating material for providing electrical insulation between the layer 316 of stress-creating material and the source region 104, the gate electrode 108 and the drain region 105. The layer of electrically insulating material may, for example, include silicon dioxide, silicon oxynitride and/or silicon nitride and may be formed by means of techniques of chemical vapor deposition or plasma enhanced chemical vapor deposition.

On the layer 316 of stress-creating material, a top stress-controlled electrode 317 may be formed.

Features of the layer 316 of stress-creating material may correspond to those of the layer 116 of stress-creating material described above with reference to FIGS. 1a-1e. In particular, the layer 316 of stress-creating material may include an electrostrictive, current-strictive or piezoelectric material. The top stress-control electrode 317 may have features corresponding to those of the top stress-control electrode 117 described above with reference to FIGS. 1a-1e.

For forming the layer 316 of stress-creating material and the top stress-control electrode 317, techniques corresponding to those used in the formation of the layer 116 of stress-creating material and the top stress-control electrode 117 as described above may be employed.

In the embodiments of FIGS. 3a and 3b, the bottom stress-control electrode 115 provided in the embodiments of FIG.

1a-1e may be omitted. An electric field acting on the layer 316 of stress-creating material may be provided by applying a voltage between the gate electrode 108 and the top stress-control electrode 317.

Above the top stress-control electrode 317, a layer 118 of dielectric material may be formed and may be planarized, for example, by means of a chemical mechanical polishing process. In the layer 118 of dielectric material, a source contact via 119, a gate contact via 120, a drain contact via 121 and a stress-control contact via 122 may be formed.

In the source contact via 119, a source contact 125 may be formed. In the gate contact via 120, a gate contact 126 may be provided. In the drain contact via 121, a drain contact 127 may be provided, and a stress-control contact 128 may be provided in the stress control contact via 122. On sidewalls of the source contact via 119, the gate contact via 120, the drain contact via 121 and the stress-control contact via 122, a liner layer 124 of an electrically insulating material may be formed.

The layer 316 of stress-creating material and the top stress-control electrode 317 may extend over substantially the entire field effect transistor 302, as shown in FIGS. 3a and 3b. In other embodiments, an etch process may be performed for removing portions of the layer 316 of stress-creating material and the top stress-control electrode 317 over portions of the source region 104, portions of the drain region 105 and the trench isolation structure 106, similar to the etching of layers 115, 116, 117 in the embodiments of FIGS. 1a-1e. In such embodiments, in the completed field effect transistor 302, the layer 316 of stress-creating material and the top stress-control electrode 317 may extend over the top surface and side surfaces of the gate electrode 108 and portions of the source region 104 and the drain region 105 adjacent the gate electrode 108, similar to the layer 116 of stress-creating material and the top stress-control electrode 117 shown in FIG. 1d.

In the field effect transistor 302, a stress in the channel region 103 may be controlled by applying an electric field to the layer 316 of stress-creating material. This can be done by applying different electrical voltages to the gate contact 126 and the stress-control contact 128, so that an electric voltage is applied between the gate electrode 108 and the top stress-control electrode 317.

Similar to the embodiments described above with reference to FIGS. 1a-1e, after the formation of the field effect transistor 302, a poling of the layer 316 of stress-creating material may be performed. This may be done by applying a voltage between the gate contact 126 and the stress-control contact 128 that is adapted for providing an electric field in the layer 316 of stress-creating material that is sufficient to provide a ferroelectric polarization of the layer 316 of stress-creating material.

Figure 4:
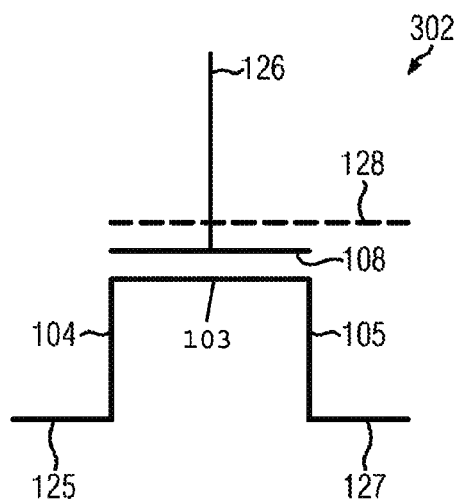
FIG. 4 shows a circuit symbol for a transistor according to an embodiment provided in the semiconductor structure according to FIGS. 3a-3b.

FIG. 4 shows a schematic circuit symbol that can be used in circuit diagrams of circuits including transistors having features corresponding to those of the transistor 302. In the circuit symbol, the source contact 125, the source region 104, the channel region 103, the drain region 105, the drain contact 127, the gate electrode 108 and the gate contact 126 are shown in accordance with conventional circuit symbols for field effect transistors. Additionally, the stress-control contact 128 is denoted by a dashed line. Similar to conventional circuit symbols for field effect transistors, an arrow at the line denoting the source region (not shown in FIG. 4) may be drawn, wherein the direction of the arrow may be used for distinguishing between N-channel transistors and P-channel transistors.

The present disclosure is not limited to embodiments wherein a layer 116, 316 of stress-creating material provides a stress that is variable in response to an electric field or current acting on the stress-creating material, as described above. In other embodiments, the stress-creating material may include a magnetostrictive material providing a stress that is variable in response to a magnetic field acting on the stress-creating material. In such embodiments, the layer of stress-creating material may include a ferromagnetic material, for example a metal such as iron, nickel or cobalt, an alloy, for example an alloy of terbium and iron such as $TbFe_2$, or an alloy of terbium, dysprosium and iron, for example $Tb_{0.3}Dy_{0.7}Fe_2$, which is also denoted as "Terfenol-D." Techniques for forming a layer of a stress-creating material including a magnetostrictive material as described above include sputtering and pulsed laser deposition.

Transistors including a layer of a stress-creating material including a magnetostrictive material may have a configuration as described above with reference to FIGS. 1a-1e, 3a and 3b, wherein, however, no stress-control electrodes, such as stress-control electrodes 115, 117 and 317, and no stress-control contacts, such as stress-control contacts 128, 129, need to be provided. Instead, layers of electrically insulating material may be provided above and/or below the layer of magnetostrictive material for providing electrical insulation between the layer of magnetostrictive material and other components of the semiconductor structure, in particular between the layer of magnetostrictive material and the source region, the gate electrode and the drain electrode of the transistor. Such electrically insulating layers may help to prevent electrical shortcuts caused by the layer of magnetostrictive material, in particular in embodiments wherein the magnetostrictive material is electrically conductive.

Figure 5:
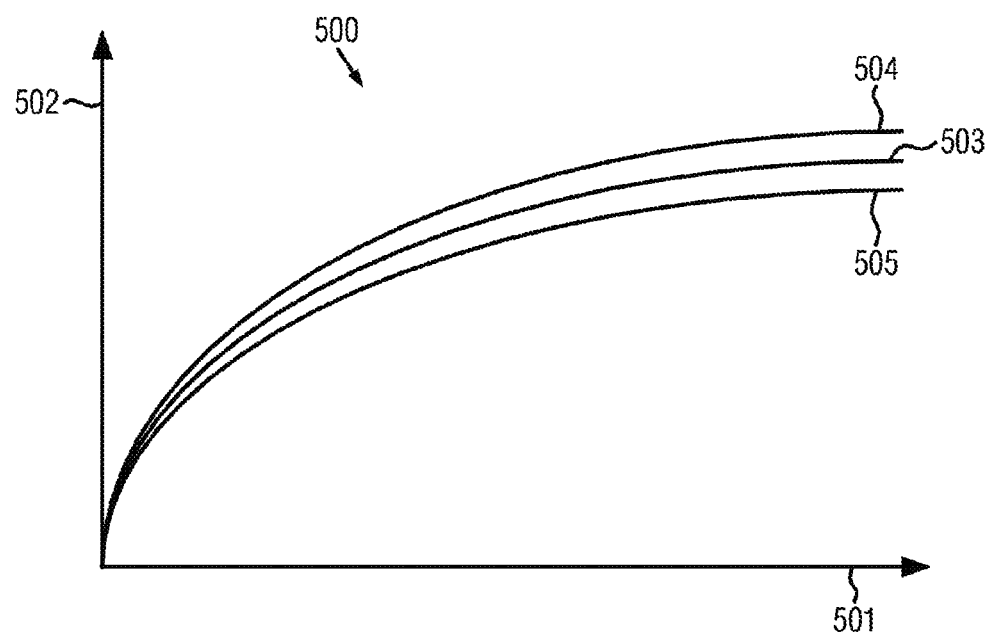
FIG. 5 shows a schematic diagram illustrating a dependency of an output current of a transistor on a drain-source voltage for different stresses in its channel region.

FIG. 5 shows a schematic diagram illustrating a dependency of an output current of an N-channel transistor which may have a configuration corresponding to that of transistor 102 described above with reference to FIGS. 1a-1e or a configuration corresponding to that of transistor 302 described above with reference to FIGS. 3a and 3b on a drain/source voltage applied between the drain region 105 and the source region 104 of the transistor when a fixed gate voltage is applied between the source region 104 and the gate electrode 108.

A horizontal coordinate axis 501 denotes the drain/source voltage, and a vertical coordinate axis 502 denotes the output current. A curve 503 schematically illustrates the dependence of the output current on the drain/source voltage in the absence of stress in the channel region 103. The output current increases with an increasing positive drain/source voltage, wherein a relatively steep increase is obtained at relatively small drain/source voltages, and a smaller slope is obtained at relatively large drain/source voltages.

Curve 504 schematically illustrates the dependency of the output current on the drain/source voltage in the presence of a tensile stress in the channel region 103. The tensile stress may increase the mobility of electrons in the channel region 103, so that a greater output current is obtained. Curve 505 schematically illustrates the dependency of the output current on the drain/source voltage in the presence of a compressive stress in the channel region 103. The compressive stress may reduce the mobility of electrons in the channel region 103, so that a smaller output current is obtained.

The output current also depends on the gate voltage that is applied between the gate electrode 108 and the source region 104 of the transistor. In the case of an N-channel transistor, the output current increases with increasing gate voltage, corresponding to the switching of the transistor from the off-state to the on-state. An N-channel field effect transistor may be in the off-state when a relatively small gate voltage is applied, and may be in the on-state when a relatively high gate voltage is applied.

In the case of P-channel transistors, typically a negative voltage is applied between the drain region 105 and the source region 104 of the transistor, so that the source region 104 is at a greater electric potential than the drain region 105. Moreover, in a P-channel transistor, the output current depends on the mobility of holes in the channel region 103. The mobility of holes may increase when a compressive stress is applied to the channel region 103, and the mobility of holes may be reduced when a tensile stress is applied to the channel region 103. Thus, in a P-channel transistor, a tensile stress in the channel region 103 may reduce the output current, and a compressive stress in the channel region may increase the output current of the transistor.

Moreover, in the case of a P-channel transistor, an increase of the gate voltage applied between the gate electrode and the source electrode of the transistor may reduce the output current of the transistor, corresponding to the switching of the transistor from the on-state to the off-state. A P-channel transistor may be in the on-state when a relatively low gate voltage is applied, and it may be in the off-state when a relatively high gate voltage is applied.

In transistors including a layer of a stress-creating material as described above with reference to FIGS. 1a-1e and FIGS. 3a-3b, the stress in the channel region 103 of the transistor provided by the layer of stress-creating material may be varied in such a manner that it supports the operation of the transistor. In particular, in an N-channel transistor, a relatively strong tensile stress in the channel region 103 may be provided when the transistor is in the on-state, so that a relatively high output current is obtained in the on-state, and a smaller tensile stress, substantially no stress or a compressive stress may be provided in the channel region 103 when the transistor is in the off-state.

In a P-channel transistor, a relatively strong compressive stress in the channel region 103 may be provided when the transistor is in the on-state, and a smaller compressive stress, substantially no stress or a tensile stress in the channel region 103 may be provided when the transistor is in the off-state.

In the transistor 102 described above with reference to FIGS. 1a-1e, the operation of the transistor 102 may be supported by controlling a voltage applied between the stress-control contacts 128, 129. When the gate voltage of the transistor 102 is changed for switching the transistor 102 between the on-state and the off-state, the voltage applied between the stress-control contacts 128, 129 may also be changed for changing the stress in the channel region 103 of the transistor 102.

In the transistor 302 described above with reference to FIGS. 3a and 3b, the operation of the transistor 302 may be supported by varying a voltage applied between the gate electrode 108 and the top stress-control electrode 317. Since, when the transistor 302 is switched between the off-state and the on-state, the voltage applied to the gate electrode 108 is changed, the electric field acting on the layer 316 of stress-creating material in the vicinity of the channel region 103 of the transistor 302 can change, even if the top stress-control electrode 317 is maintained at substantially the same voltage. Thus, in the transistor 302, a variation of the stress in the channel region 103 of the transistor 302 may be obtained when the transistor 302 is switched between the on-state and the off-state, even if the top stress-control electrode 317 is maintained at a substantially constant bias voltage or is connected to ground.

The strength of the electric field applied to the layer 116 of stress-creating material in the transistor 102, which depends on the voltage applied between the bottom stress-control electrode 115 and the top stress-control electrode 117 in the transistor 102, as well as the strength of the electric field in the layer 316 of stress-creating material, that depends on the voltage between the gate electrode 108 and the top stress-control electrode 317 in the transistor 302, may be selected in accordance with properties of the materials of the layer 116 of stress-creating material and the layer 316 of stress-creating material, respectively, and in accordance with the desired stress to be provided in the channel region 103 of the transistor.

In some embodiments, the stress-creating material may be a material that has substantially no stress hysteresis or provides only a small amount of stress hysteresis. Thus, the stress provided in the channel region 103 of the transistor may be substantially independent of the history of operation of the transistor. Thus, the stress in the channel region 103 may be provided in accordance with the current state of the transistor in a convenient manner for supporting the operation of the transistor, for example, for improving the switching speed of the transistor.

In other embodiments, a stress-creating material having a stress hysteresis may be provided in the layer 116 of stress-creating material of the transistor 102 described above with reference to FIGS. 1a-1e, or in the layer 316 of stress-creating material of the transistor 302 described above with reference to FIGS. 3a and 3b.

Figure 6:
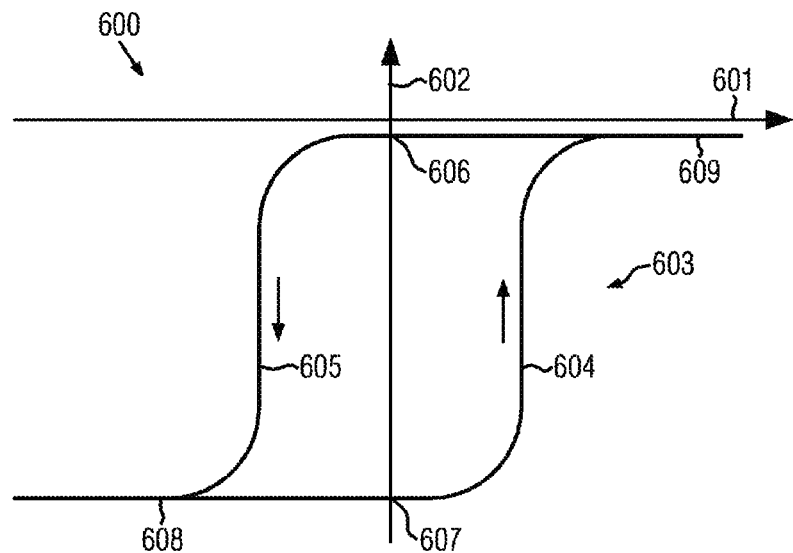
FIG. 6 shows a schematic diagram illustrating a stress hysteresis.

FIG. 6 shows a schematic diagram 600 illustrating a stress hysteresis. A horizontal coordinate axis 601 denotes a strength of an electric field applied to a stress-creating material having a stress hysteresis such as, for example, PMN-PT, and a vertical coordinate axis 602 denotes a stress provided by the layer of stress-creating material, which may also be associated with a strain (deformation) of the layer of stress-creating material.

In the diagram 600, negative and positive values of the electric field are used to denote a direction of the electric field. Negative values of the electric field correspond to an electric field whose field lines extend in a first direction, and positive values of the electric field correspond to an electric field whose field lines extend in a second direction that is opposite to the first direction.

If a relatively strong negative electric field is applied to the layer of stress-creating material as, for example at point 608, a relatively strong negative or compressive, respectively, stress may be obtained. If, starting from the relatively strong negative electric field, the absolute value of the electric field is reduced, the stress provided by the layer of stress-creating material may vary in accordance with the branch 604 of the curve 603. In particular, when the electric field is approximately zero, a residual stress 607 of the layer of stress-creating material may be obtained.

When a positive electric field is applied thereafter, a weaker compressive stress of the layer of stress-creating material may be obtained. At a relatively high positive value of the electric field as, for example, at point 609, a relatively weak compressive stress or substantially no compressive stress at all may be obtained.

If, starting from point 609, the strength of the electric field is reduced, the stress of the layer of stress-creating material may vary in accordance with the branch 605 of the curve 603. In particular, if, starting from a relatively strong positive value of the electric field, the strength of the electric field is reduced to substantially zero, a relatively weak residual compressive stress 606 may be obtained. Starting from the relatively weak residual compressive stress 606, a substantial compressive stress of the layer of stress-creating material may be obtained by applying a relatively strong negative electric field.

Accordingly, the stress provided by the layer of stress-creating material may depend on the history of the electric field applied to the layer of stress-creating material. As shown in FIG. 6, a different residual stress 606 or 607, respectively, may be obtained, depending on whether a positive or negative electric field has been applied to the layer of stress-creating material, even when the electric field is no longer applied. Moreover, the particular value of the residual strain may depend on the specific positive or negative value of the electric field that has been applied.

Hence, providing a layer of a stress-creating material having a stress hysteresis may allow varying the stress provided by the stress-creating material by applying an electric field to the layer of stress-creating material, and the stress provided by the layer of stress-creating material may be maintained at least partially when the electric field is no longer applied.

The curve 603 illustrating the dependence of the stress provided by the layer of stress-creating material on the electric field applied to the layer of stress-creating material need not have a shape as shown in FIG. 6. For example, the stress provided by the layer of stress-creating material, if a relatively strong positive electric field is applied, need not be approximately zero. In other embodiments, a relatively strong positive or tensile stress may be provided when a relatively strong positive electric field is applied. In such embodiments, the stress obtained in the presence of a relatively strong negative electric field may be negative or approximately zero. In further embodiments, a relatively strong positive or tensile stress may be provided when a relatively strong negative electric field is applied, and a negative or compressive, respectively, stress may be obtained if a positive electric field is applied, or a substantially zero stress may be obtained when a positive electric field is applied.

The particular dependency of the stress provided by the layer of stress-creating material may depend on the material from which the layer of stress-creating material is formed, as well as on parameters of the deposition process, and on the poling of the layer of stress-creating material, in particular on the direction of the electric field that is applied when the layer of stress-creating material is poled, see, for example, Wu et. al., "Domain engineered switchable strain states in ferroelectric (011) [Pb(Mg$_{1/3}$Nb$_{2/3}$)O$_3$]$_{(1-x)}$—[PbTiO$_3$]$_x$ (PMN-PT, x≈0.32) single crystals," *J. Appl. Phys.*, 109:124101, 2011, the disclosure of which is incorporated herein by reference.

In the following, embodiments of circuits including transistors including a layer of stress-creating material will be described.

Figure 7:
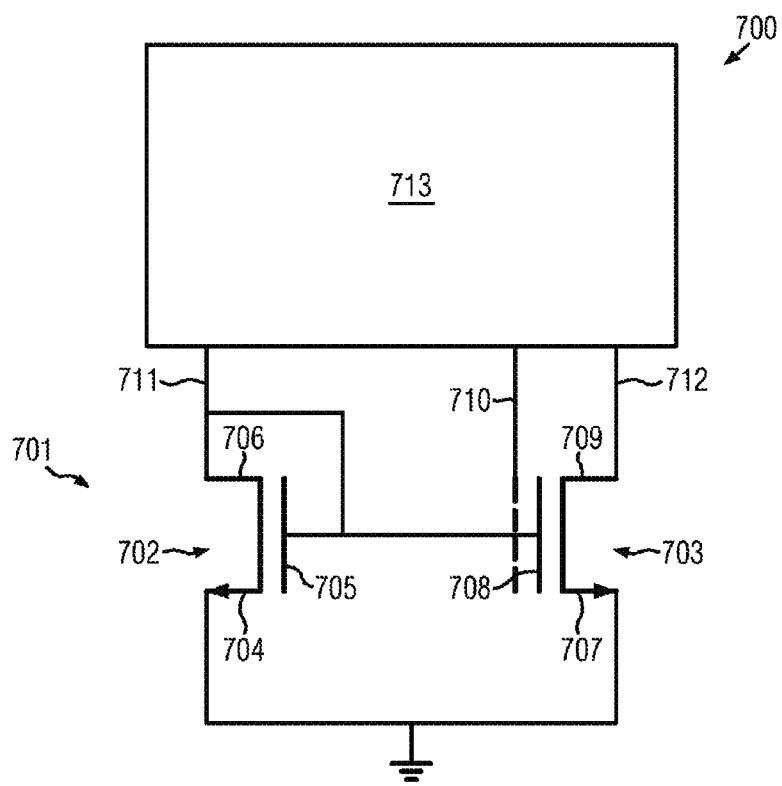
FIG. 7 shows a schematic circuit diagram of a circuit according to an embodiment.

FIG. 7 shows a schematic circuit diagram of a circuit 700 according to an embodiment. The circuit 700 includes a current mirror circuit 701. The current mirror circuit 701 includes a transistor 702 and a transistor 703, which may, in some embodiments, be N-channel field effect transistors. The transistor 702 may be a conventional field effect transistor including a source region 704, a drain region 706 and a gate electrode 705. In some embodiments, the transistor 702 may include a layer of a material having an intrinsic stress formed above the source region 704, the drain region 706 and/or the gate electrode 705. The layer of the material having an intrinsic stress may provide a substantially constant stress in the channel region of the transistor 702. In other embodiments, the channel region of the transistor 702 may be substantially unstressed.

The transistor 703 may be a transistor having features corresponding to those of transistor 302 described above with reference to FIGS. 3a and 3b. In particular, the transistor 703 may include a source region 707 similar to source region 104, a drain region 709 similar to drain region 105, and a gate electrode 708 similar to gate electrode 108.

Moreover, the transistor 703 includes a layer of a stress-creating material that provides a stress in the channel region of the transistor 703 that is variable in response to an electric field acting on the stress-creating material. The layer of stress-creating material may include a material having a stress hysteresis as described above with reference to FIG. 6. Further features of the layer of stress-creating material may correspond to the features of the layer 316 of stress-creating material described above.

The transistor 703 further includes a stress-control contact 710, similar to stress control contact 128, that may be connected to a stress-control electrode similar to the top stress-control electrode 317 of the transistor 302. A stress provided by the layer of stress-creating material is variable in response to a signal applied to the layer of stress-creating material provided in the form of an electric field that may be created by applying a voltage difference between the gate electrode 708 of transistor 703 and the stress-control contact 710.

The circuit 700 further includes a calibration circuit 713. The calibration circuit 713 may be electrically connectable to an input terminal 711 and an output terminal 712 of the current mirror circuit 701 and to the stress-control contact 710 of the transistor 703.

The calibration circuit 713 may be electrically connected to the input terminal 711, the output terminal 712 and the stress-control contact 710 for calibrating the current mirror circuit 701, as will be described below. After the calibration of the current mirror circuit 701, the calibration circuit 713 may be electrically disconnected from the input terminal 711, the stress-control contact 710 and the output terminal 712, and the input terminal 711 and the output terminal 712 may be electrically connected to other components of the circuit 700 (not shown). For connecting and disconnecting the calibration circuit 713 to the input terminal 711 and the output terminal 712, the circuit 700 may include transmission gate circuits.

In some embodiments, the circuit 700 may include a plurality of current mirror circuits similar to current mirror circuit 701, and the calibration circuit 713 may be alternatively connectable to each of the current mirror circuits. Thus, the other current mirror circuits in the circuit 700 may be calibrated before or after the calibration of the current mirror circuit 701.

In the current mirror circuit 701, the gate electrodes 705, 708 of the transistors 702, 703 are electrically connected with each other and are electrically connected to the input terminal 711. The source regions 704, 707 of the transistors 702, 703 may be electrically connected to ground.

The current mirror circuit 701 comprises an input current path provided by the input terminal 711, the transistor 702 and the connection of the source region 704 of the transistor 702 to ground. Additionally, the current mirror circuit 701 comprises an output current path provided by the output terminal 712, the transistor 703 and the connection of the source 707 of the transistor 703 to ground. Thus, a current applied to the input terminal 711 flows through the input current path, and a current applied to the output terminal 712 flows through the output current path.

If a current is applied to the input terminal 711, the current flows through the drain region 706, the channel region and the source region 704 of the transistor 702. Due to the connection between the gate electrode 705 of the transistor 702 and the input terminal 711, which is electrically connected to the drain region 706 of the transistor 702, a gate voltage of the transistor 702 corresponding to current applied to the input terminal 711 is obtained. Due to the electrical connection between the gate electrodes 705, 708 of the transistors 702, 703, the gate voltage of the transistor 702 is also applied to the gate electrode 708 of the transistor 703. Thus, a current flowing from the output current path may be controlled by the current applied to the input terminal 711.

If the characteristics of the transistors 702, 703 are substantially identical, the current flowing through the transistor 702 and the current flowing through the transistor 703 are substantially equal. If the transistors 702, 703 have different characteristics, the current flowing through the input terminal 711 and the transistor 702 and the current flowing through the output terminal 712 and the transistor 703 may be different. The current flowing through the output terminal 712 at a given current flowing through the input terminal 711 may depend on characteristics of the transistor 703, such as the width of the channel region of the transistor, and it may also depend on the stress in the channel region of the transistor 703.

In some embodiments, the current mirror circuit 701 may be adapted for providing substantially equal currents through the input terminal 711 and the output terminal 712. In such embodiments, the transistor 703 may be formed with a channel region having a width that is substantially equal to the width of the channel region of the transistor 702. In other embodiments, the current mirror circuit 701 may be adapted to provide a current through output terminal 712 that is approximately equal to a product of a multiplication factor and the current flowing through the input terminal 711. In such embodiments, the width of the channel region of the transistor 703 may be approximately equal to a product of the multiplication factor and the width of the channel region of the transistor 702. For example, for providing a current through the output terminal 712 that is approximately twice the current flowing through the input terminal 711, the width of the channel region of the transistor 703 may be approximately two times the width of the channel region of the transistor 702.

Due to tolerances of the manufacturing process of the circuit 700, the ratio between the current flowing through the output terminal 712 and the current flowing through the input terminal 711 may be different from the multiplication factor. To compensate for such deviations, a calibration of the current mirror circuit 701 may be performed by means of the calibration circuit 713, as will be detailed in the following.

For performing the calibration of the current mirror circuit 701, the calibration circuit 713 is connected to the input terminal 711, the output terminal 712 and the stress-control contact 710. Then, the calibration circuit 713 applies a current to the input terminal 711 and applies a voltage to the output terminal 712. The calibration circuit 713 detects a current difference between the current flowing through the input terminal 711 and a ratio between the current flowing through the output terminal 712 and the multiplication factor, and applies a voltage to the stress-control contact 710 in response to the detected current difference so that the current difference is reduced.

In some embodiments, the calibration circuit 713 may include a comparator. The comparator may have a non-inverting input and an inverting input, and an output. The comparator may be adapted to provide a positive output voltage if a voltage applied to the non-inverting input is greater than a voltage applied to the inverting input, and it may output a negative output voltage if a voltage applied to the non-inverting input is smaller than a voltage applied to the inverting input.

The output of the comparator may be electrically connected to the stress-control contact 710 of the transistor 703. The calibration circuit 713 may include circuitry for applying a voltage that is representative of the current flowing through the input terminal 711 of the current mirror circuit 701 to the non-inverting input of the comparator. Additionally, the calibration circuit 713 may include circuitry for applying a voltage that is representative of a ratio between the current flowing through the output terminal 712 of the current mirror circuit 701 and the multiplication factor to the inverting input of the comparator. In particular, in embodiments wherein a desired output current of the current mirror circuit 701 is equal to the input current of the current mirror circuit 701, a voltage that is representative of the current flowing through the output terminal 712 may be applied to the inverting input of the comparator.

Thus, the output of the comparator is a positive voltage if the current difference between the current flowing through the input terminal 711 and the ratio between the current flowing through the output terminal 712 and the multiplication factor is greater than zero, and the output of the comparator is a negative voltage if the current difference is negative.

The output voltage of the comparator that is applied to the stress-control contact 710 of the transistor 703 may influence the stress provided by the layer of stress-creating material of the transistor 703 in the channel region of the transistor 703.

In embodiments wherein the transistor 703 is an N-channel transistor as shown in FIG. 7, the layer of stress-creating material of the transistor 703 may be adapted such that a greater tensile stress is provided in the channel region of the transistor 703 and/or a compressive stress in the channel region 703 is reduced when a positive voltage is applied to the stress-control contact 710, and a tensile stress in the channel region of the transistor 703 is reduced and/or a greater compressive stress in the channel region 703 is provided when a negative voltage is applied to the stress-control contact 710. This may be obtained by an appropriate selection of the material of the layer of stress-creating material in the transistor 703 and/or by an appropriate selection of parameters employed in the deposition of the stress-creating material and/or an appropriate poling of the layer of stress-creating material, as described above.

An increase of a tensile stress and/or a reduction of a compressive stress in the channel region of an N-channel transistor may increase an output current of the transistor that is obtained at a given gate voltage. Hence, by applying a positive voltage to the stress-control contact 710 of the transistor 703, the output current of the current mirror circuit 701 flowing through the output terminal 712 may be increased, and the output current of the current mirror circuit 701 flowing through the output terminal 712 of the current mirror circuit 701 may be reduced by applying a negative voltage to the stress-control contact 710.

Therefore, by applying the output of the comparator to the stress-control contact 710, the absolute value of the current difference between the input current and the ratio between the output current and the multiplication factor may be reduced. Thus, a lack of matching between the transistors 702, 703 may be reduced, so that the ratio between the output current of the current mirror circuit 701 and the input current of the current mirror circuit 701 is in better conformity with the multiplication factor.

The present disclosure is not limited to embodiments wherein the non-inverting input of the comparator receives a voltage representative of the input current and the inverting input of the comparator receives a voltage representative of the ratio between the output current and the multiplication factor. In other embodiments, a voltage representative of a ratio between the output current and the multiplication factor may be applied to the non-inverting input, and a voltage representative of the input current may be applied to the inverting input.

Thus, a matching of the transistors 702, 703 may be improved in embodiments wherein the layer of stress-creating material of the transistor 703 provides a smaller tensile stress and/or a greater compressive stress if a positive voltage is applied to the stress-control contact 710 and the layer of stress-creating material provides a greater tensile stress and/or a smaller compressive stress if a negative voltage is applied to the stress-controlled contact 710.

Moreover, the present disclosure is not limited to embodiments wherein the transistor 703 has a configuration corresponding to that of the transistor 302 described above with reference to FIGS. 3a and 3b. In other embodiments, the transistor 703 may have a configuration corresponding to that of the transistor 102 described above with reference to FIGS. 1a-1e, wherein a top stress-control electrode and a bottom stress-control electrode are provided above and below the layer of stress-creating material, respectively.

In such embodiments, the output of the comparator may be electrically connected to one of a stress-control contact electrically connected to the top stress-control electrode and a stress-control contact electrically connected to the bottom stress-control electrode, and the other of the top stress-control electrode and the bottom stress-control electrode may be grounded, or a substantially constant bias voltage may be applied to the other of the top stress-control electrode and the bottom stress-control electrode. Thus, the stress provided by the layer of stress-creating material of the transistor 703 may be controlled substantially independent of the voltage applied to the gate electrode 708 of the transistor 703.

In further embodiments, both the transistor 702 and the transistor 703 may include a layer of stress-creating material and the calibration circuit 713 may be adapted for adjusting both the stress provided by the layer of stress-creating material in the transistor 702 and the stress provided by the layer of stress-creating material in the transistor 703.

After the calibration of the current mirror circuit 701, the calibration circuit 713 may be electrically disconnected from the current mirror circuit 701. Due to the stress hysteresis of the layer(s) of stress-creating material in the transistor 702 and/or the transistor 703, the stress may be substantially maintained, so that the matching between the transistors 702, 703 obtained by the calibration process is maintained.

In further embodiments, the calibration circuit 713 may be adapted for setting the multiplication factor. In such embodiments, the calibration circuit 713 may have an external input for setting the multiplication factor.

Figure 8:
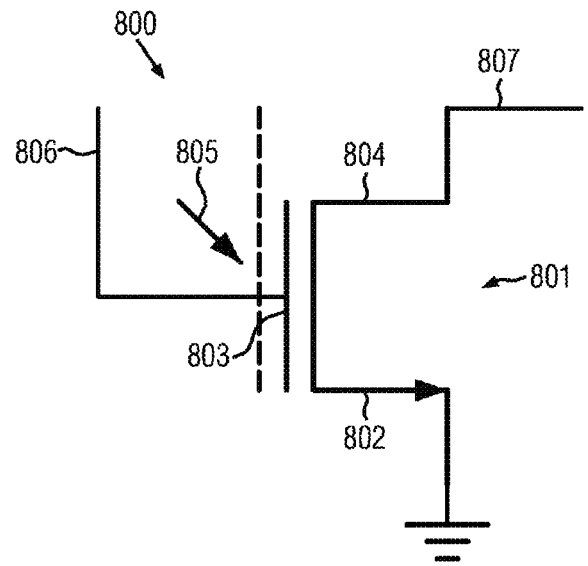
FIG. 8 shows a schematic circuit diagram of a sensor according to an embodiment.

FIG. 8 shows a schematic circuit diagram of a sensor 800 according to an embodiment. The sensor 800 includes a transistor 801 including a source region 802, a drain region 804 and a gate electrode 803. The transistor 801 may be an N-channel transistor, as shown in FIG. 8. In other embodiments, the transistor 801 may be a P-channel transistor. The gate electrode 803 of the transistor 801 may be electrically connected to a read terminal 806 and the drain region 804 may be electrically connected to an output terminal 807. The source region 802 of the transistor 801 may be connected to ground.

The transistor 801 includes a layer of stress-creating material that is arranged to provide a stress in the channel region of the transistor 801, wherein the stress provided in the channel region of the transistor 801 is variable in response to an external influence acting on the stress-creating material. The stress-creating material may be a magnetostrictive material, as described above, and the external influence may be a magnetic field 805. Thus, the stress provided in the channel region of the transistor 801 may be variable in response to the magnetic field 805 acting on the stress-creating material.

For performing a measurement by means of the sensor 800, a gate voltage may be applied to the read terminal 806 for switching the transistor 801 into the on-state. Additionally, a voltage may be applied to the output terminal 807. Since the transistor 801 is in the on-state, a current through the transistor 801 that flows through the channel region of the transistor 801 may be obtained.

As detailed above, the electric conductivity of the channel region of the transistor 801 depends on the stress in the channel region. Since the transistor 801 includes a layer of stress-creating material providing a stress in the channel region of the transistor that is variable in response to an external influence, such as magnetic field 805 acting on the layer of stress-creating material, the current flowing through the transistor 801 may depend on the strength of the external influence. Therefore, the strength of the external influence, in particular, the strength of magnetic field 805, may be determined by measuring the current flowing through the transistor 801.

For applying voltages to the read terminal 806 and the output terminal 807, and for measuring the current flowing through the output terminal 807 and the transistor 801, a circuit (not shown) may be provided.

Figure 9:
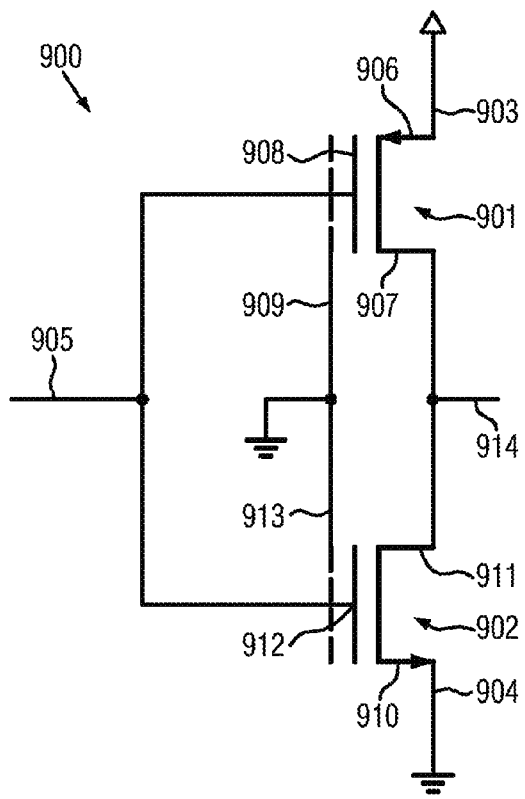
FIG. 9 shows a schematic circuit diagram of an inverter according to an embodiment.

FIG. 9 shows a schematic circuit diagram of an inverter 900 according to an embodiment. The inverter 900 includes a pull-up transistor 901 that may be a P-channel transistor and a pull-down transistor 902 that may be an N-channel transistor. The pull-up transistor 901 includes a source region 906, a drain region 907 and a gate electrode 908. The pull-down transistor 902 includes a source region 910, a drain region 911 and a gate electrode 912.

The pull-up transistor 901 and the pull-down transistor 902 are electrically connected in series between a high voltage power supply terminal 903 and a low voltage power supply terminal 904, wherein the drain regions 907, 911 of the pull-up transistor 901 and the pull-down transistor 902 are connected to each other, the source region 906 of the pull-up transistor 901 is electrically connected to the high voltage power supply terminal 903, and the source region 910 of the pull-down transistor 902 is electrically connected to the low voltage power supply terminal 904.

The gate electrodes 908, 912 of the pull-up transistor 901 and the pull-down transistor 902 are electrically connected to an input terminal 905. An output terminal 914 of the inverter 900 is electrically connected to the drain regions 907, 911 of the pull-up transistor 901 and the pull-down transistor 902.

If a relatively high voltage is applied to the input terminal 905, the pull-up transistor 901, being a P-channel transistor, is switched to the off-state, and the pull-down transistor 902, being an N-channel transistor, is switched to the on-state. Thus, the output terminal 914 is electrically connected to the low voltage power supply terminal 904 and a relatively low voltage is obtained at the output terminal 914. If a relatively low voltage is applied to the input terminal 905, the pull-up transistor 901 is switched into the on-state and the pull-down transistor 902 is switched into the off-state. Thus, the output terminal 914 is electrically connected to the high voltage power supply terminal 903, so that a relatively high voltage is obtained at the output terminal 914.

Each of the pull-up transistor 901 and the pull-down transistor 902 may have features corresponding to those of the transistor 302 described above with reference to FIGS. 3a and 3b. In particular, the pull-up transistor 901 may include a layer of stress-creating material providing a stress in the channel region of the pull-up transistor that is variable in response to an electric field applied to the layer of stress-creating material. Moreover, the pull-up transistor 901 includes a stress-control contact 909 that is electrically connected to a stress-control electrode provided on a side of the layer of stress-creating material that is opposite the gate electrode 908 of the pull-up transistor. Thus, a voltage difference between the stress-control contact 909 and the gate electrode 908 creates an electric field in the layer of stress-creating material of the pull-up transistor 901.

Similarly, the pull-down transistor 902 may include a layer of stress-creating material providing a stress in the channel region of the pull-down transistor 902 that is variable in response to an electric field applied to the layer of stress-creating material. Moreover, the pull-down transistor 902 includes a stress-control electrode provided on a side of the layer of stress-creating material opposite the gate electrode 912 of the pull-down transistor 902 and a stress-control contact 913 electrically connected to the stress-control electrode, so that a voltage difference between the stress-control contact 913 and the gate electrode 912 creates an electric field in the layer of stress-creating material of the pull-down transistor 902.

The layers of stress-creating material in the transistors 901, 902 may be adapted to provide substantially no stress hysteresis or only a small amount of stress hysteresis.

The stress-control contacts 909, 913 of the pull-up transistor 901 and the pull-down transistor 902, respectively, may be electrically connected to each other and to ground. Thus, the stress-control contacts 909, 913 may be maintained at a substantially constant voltage that may be approximately equal to the above-mentioned relatively low voltage. Thus, a relatively strong electric field is applied to the layers of stress-creating material in the pull-up transistor 901 and the pull-down transistor 902 if the relatively high voltage is applied to the input terminal 905, and a relatively small electric field or substantially no electric field is applied to the layers of stress-creating material in the pull-up transistor 901 and the pull-down transistor 902 if the relatively low voltage is applied to the input terminal 905.

The layers of stress-creating material in the pull-up transistor 901 and the pull-down transistor 902 may be adapted to provide an increase of a tensile stress and/or a reduction of a compressive stress in the channel regions of the transistors 901, 902 when the electric field applied to the layers of stress-creating material is increased, and to provide a reduction of tensile stress and/or an increase of compressive stress when the electric field applied to the layers of stress-creating material is reduced.

Hence, if the relatively high voltage is applied to the input terminal 905, the channel regions of the transistors 901, 902 are exposed to a more tensile stress than if the relatively low voltage is applied to the input terminal 905. An increase of tensile stress or a reduction of compressive stress may increase the conductivity of the channel region of the pull-down transistor 902, being an N-channel transistor, and may reduce the conductivity of the channel region of pull-up transistor 901, being a P-channel transistor. A reduction of tensile stress or an increase of compressive stress, which may be obtained when the relatively low voltage is applied to the input terminal 905, increases the electric conductivity of the channel region of pull-up transistor 901 and reduces the electrical conductivity of the channel region of pull-down transistor 902.

Thus, the electrical conductivity of the channel region of the one of the pull-up transistor 901 and the pull-down transistor 902 that is in the on-state may be increased, and the conductivity of the channel region of the one of the pull-up transistor 901 and the pull-down transistor 902 that is in the off-state may be reduced. This may allow an improvement of the switching speed of the inverter 901 compared to inverters wherein no layers of stress-creating material providing a variable stress are provided in the pull-up transistor and the pull-down transistor.

Figure 10:
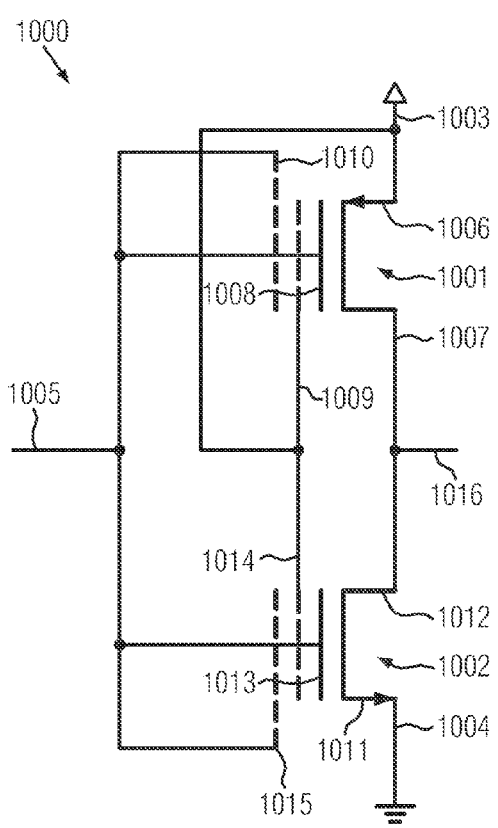
FIG. 10 shows a schematic circuit diagram of an inverter according to an embodiment.

FIG. 10 shows an inverter 1000 according to another embodiment. Similar to the inverter 900 described above with reference to FIG. 9, the inverter 1000 includes a pull-up transistor 1001, being a P-channel transistor, and a pull-down transistor 1002, being an N-channel transistor, which are electrically connected in series between a high voltage power supply terminal 1003 and a low voltage power supply terminal 1004. A drain region 1007 of the pull-up transistor 1001 and a drain region 1012 of the pull-down transistor 1002 are electrically connected to each other and to an output terminal 1016.

A source region 1006 of the pull-up transistor 1001 is electrically connected to the high voltage power supply terminal 1003, and a source region 1011 of the pull-down transistor 1002 is electrically connected to the low voltage power supply terminal 1004. A gate electrode 1008 of the pull-up transistor 1001 and a gate electrode 1013 of the pull-down transistor 1002 are electrically connected to each other and to an input terminal 1005.

Each of the pull-up transistors 1001 and the pull-down transistor 1002 may have features corresponding to those of transistor 102 described above with reference to FIGS. 1a-1e. In particular, each of the pull-up transistor 1001 and the pull-down transistor 1002 may include a layer of stress-creating material similar to the layer 116 of stress-creating material, a bottom stress-control electrode similar to bottom stress-control electrode 115 and a top stress-control electrode similar to top stress-control electrode 117. Each of the pull-up transistor 1001 and the pull-down transistor 1002 includes a stress-control contact 1009 and 1014, respectively, that is electrically collected to one of the top stress-control electrode and the bottom stress-control electrode, and a stress-control contact 1010 and 1015, respectively, providing electrical contact to the other of the top stress-control electrode and the bottom stress-control electrode.

The layers of stress-creating material of the pull-up transistor 1001 and the pull-down transistor 1002 may be adapted to have substantially no stress hysteresis or only a small amount of stress hysteresis.

The stress-control contacts 1009, 1014 may be electrically connected to each other and to the high voltage power supply terminal 1003, so that a relatively high voltage is applied to the stress-control contacts 1009, 1014. The stress-control contacts 1010, 1015 may be electrically connected to the input terminal 1005.

If a relatively high voltage is applied to the input terminal 1005, a relatively small electric field or substantially no electric field at all is provided in the layers of stress-creating material of the pull-up transistor 1001 and the pull-down transistor 1002, and a relatively strong electric field is provided in the layers of stress-creating material of the transistors 1001, 1002, if a relatively low voltage is applied to the input terminal 1005.

The layers of stress-creating material of the pull-up transistor 1001 and the pull-down transistor 1002 may be formed of a material providing a stronger compressive or a weaker tensile stress in the presence of a relatively strong electric field than in the absence of an electric field. Thus, if a relatively low voltage is applied to the input terminal 1005, a weaker tensile stress or a greater compressive stress is provided in the channel regions of the transistors 1001, 1002, and if a relatively high electric voltage is applied to the input terminal 1005, a small compressive stress or greater tensile stress is provided in the channel regions of the transistors 1001, 1002.

Hence, similar to the inverter 900 described above with reference to FIG. 9, the electrical conductivity of the channel region of the one of the transistors 1001, 1002 that is in the on-state is increased, and the conductivity of the channel region of the other of the transistors 1001, 1002 that is in the off-state is reduced. Hence, the switching speed of the inverter may be improved.

The inverter 1000 of FIG. 10 allows the use of different stress-providing materials in the layers of stress-creating material of the pull-up transistor and pull-down transistor whose behavior in the presence of an electric field is inverse to the behavior of the stress-creating materials provided in the embodiment of FIG. 9.

Figure 11:
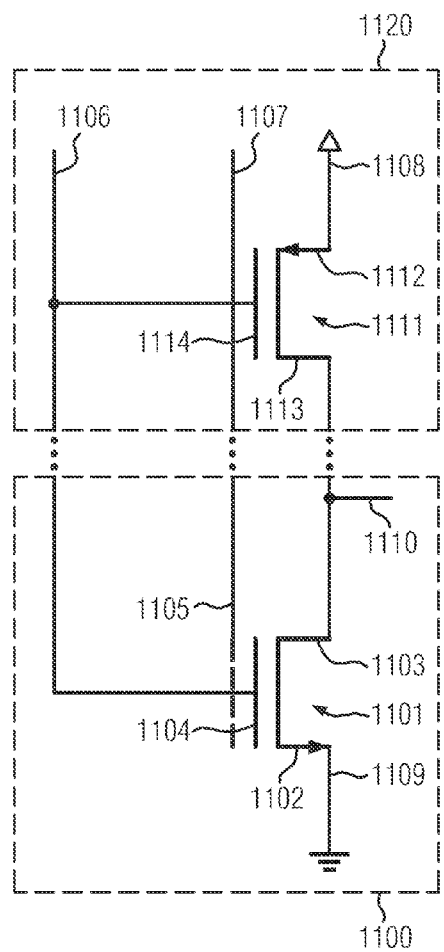
FIG. 11 shows a schematic circuit diagram of a memory cell and portions of a support circuit according to an embodiment.

FIG. 11 shows a schematic circuit diagram of a memory cell 1100 and portions of a support circuit 1120 according to an embodiment.

The memory cell 1100 includes a storage transistor 1101. The storage transistor 1101 may be a transistor similar to transistor 302 described above with reference to FIGS. 3a and 3b. In particular, the transistor 1101 includes a source region 1102, a drain region 1103 and a gate electrode 1104. Additionally, the storage transistor 1101 includes a layer of stress-creating material similar to the layer 316 of stress-creating material and a stress-control contact 1105 electrically connected to a stress-control electrode similar to the top stress-control electrode 317 that is provided on a side of the layer of stress-creating material opposite the gate electrode 1104.

The stress-creating material in the layer of stress-creating material of the storage transistor 1101 is adapted to provide a stress in the channel region of the storage transistor 1101 that is variable in response to an electric field applied to the layer of stress-creating material. The electric field applied to the layer of stress-creating material may be provided by applying a voltage between the stress-control contact 1105 and the gate electrode 1104 of the storage transistor 1101. The stress-creating material has a stress hysteresis, so that at least a portion of the stress provided in response to the electric field is maintained after removal of the electric field. Thus, a stress of the layer of the stress-creating material of the storage transistor 1101 may be set by applying a voltage between the gate electrode 1104 and the stress-control electrode 1105, and the set stress of the layer of stress-creating material may be maintained when the voltage is no longer applied.

The support circuit 1120 includes a high voltage power supply terminal 1108 and the memory cell 1100 includes a low voltage power supply terminal 1109. The storage transistor 1101 and a sense transistor 1111 that is provided in the support circuit 1120 are electrically connected in series between the high voltage power supply terminal 1108 and the low voltage power supply terminal 1109.

The memory cell 1100 may be part of a memory array comprising a plurality of memory cells having a configuration corresponding to that of the memory cell 1100. The support circuit 1120 may be provided in a support circuit block arranged around the array, and may be electrically connected to the memory cell 1100 when data is to be read from the memory cell 1100 or data is to be written to the memory cell 1100. When data is to be read from another memory cell or data is to be written to another memory cell, the support circuit 1120 may be electrically connected to the other memory cell. For this purpose, further circuit elements (not shown) may be provided, as schematically shown by dots ( . . . ) in FIG. 11. Thus, in the array of memory cells, only one transistor needs to be provided for each memory cell, so that the amount of space required by the array of memory cells may be reduced.

The storage transistor 1101 may be an N-channel transistor and the sense transistor 1111 may be a P-channel transistor. In such embodiments, the source region of the storage transistor 1101 may be electrically connected to the low voltage power supply terminal 1109 and a source region 1112 of the sense transistor 1111 may be electrically connected to the high voltage power supply terminal 1108. The gate electrode 1104 of the storage transistor 1101 and a gate electrode 1114 of the sense transistor 1111 may be electrically connected to a read terminal 1106. The stress-control contact 1105 of the storage transistor 1101 may be electrically connected to a write terminal 1107. Drain regions of the transistors 1101, 1111 may be electrically connected to a bit line terminal 1110.

Threshold voltages of the storage transistor 1101, being an N-channel transistor, and the sense transistor 1111, being a P-channel transistor, may be adapted such that there is a range of voltages applied to the read terminal 1106, wherein both the storage transistor 1101 and the sense transistor 1111 are in an electrically conductive on-state.

Figure 12:
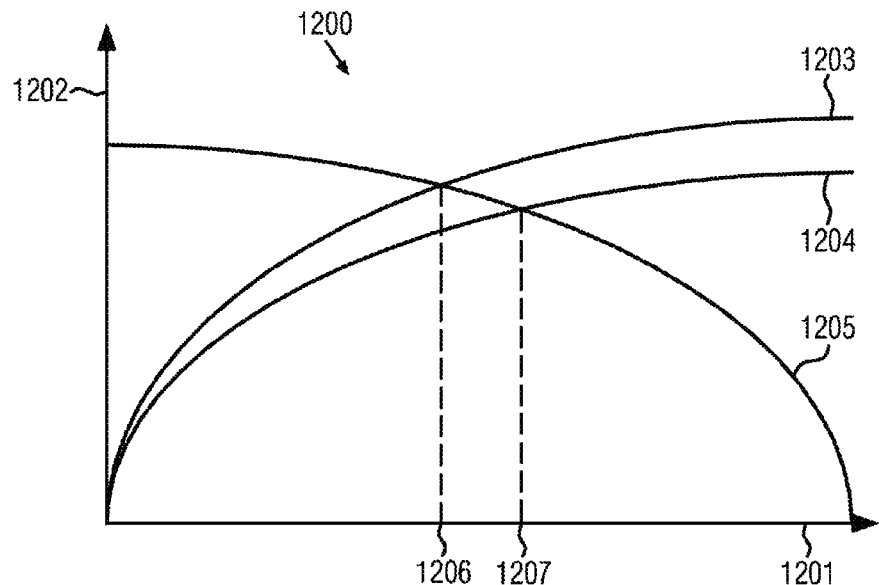
FIG. 12 shows a schematic diagram illustrating an operation of the memory cell according to FIG. 11.

The operation of the memory cell 1100 will be explained with reference to FIG. 12. FIG. 12 shows a schematic diagram illustrating a relationship between a voltage of the bit line terminal 1110 and currents through the storage transistor 1101 and the sense transistor 1111. A horizontal coordinate axis 1201 denotes the voltage of the bit line terminal 1110, and a vertical coordinate axis 1202 denotes the amperage of the current. In the following, it is assumed that no current is drawn through the bit line terminal 1110, which may be obtained by connecting the bit line terminal 1110 to a sense amplifier having high input impedance.

Thus, the current flowing through the sense transistor 1111 and the current flowing through the storage transistor 1101 are substantially equal. Curve 1203 denotes a relationship between the voltage of the bit line terminal 1110 and the current through the storage transistor 1101 that is obtained for a first stress in the channel region of the storage transistor 1101. Curve 1204 denotes a relationship between the voltage of the bit line terminal 1110 and the current through the storage transistor 1101 that is obtained for a second stress in the channel region of the storage transistor 1101, wherein the first stress is more tensile or less compressive than the second stress. Since the mobility of charge carriers in the channel region of N-channel storage transistor 1101 increases with an increasing tensile stress in the channel region, the current through the storage transistor 1100 at the first stress is greater than the current at the second stress at a given voltage of the bit line terminal 1110.

Curve 1205 denotes a relationship between the current through the sense transistor 1111 and the voltage of the bit line terminal 1110. Since the voltage applied between the source region 1112 and the drain region 1113 of the sense transistor 1111 decreases when the voltage of the bit line terminal 1110 increases, and increases when the voltage of the bit line terminal 1110 decreases, the current through the sense transistor 1111 decreases with increasing voltage of the bit line terminal 1110.

In the absence of a substantial current through the bit line terminal 1110, the currents through the sense transistor 1111 and the storage transistor 1101 are substantially equal, so that the voltage of the bit line terminal 1110 is given by an intersection between the curve 1205 and the one of the curves 1203, 1204 that corresponds to the current stress provided by the layer of stress-creating material in the storage transistor 1101.

Hence, for the first stress, a voltage 1206 of the bit line terminal 1110 may be obtained, and for the second stress, a voltage 1207 of the bit line terminal 1110 may be obtained.

This relationship between the stress provided by the layer of stress-creating material in the storage transistor 1101 may be used for storing one bit of data in the memory cell 1100. The first stress (represented by curve 1203) may be identified with a logical zero, and the second stress (represented by curve 1204) may be identified with a logical one.

For reading the bit of data, a gate voltage may be applied to the read terminal 1106, and the voltage obtained at the bit line terminal 1110 may be measured. For writing data to the memory cell 1100, a voltage may be applied between the write terminal 1107 and the read terminal 1106 that is suitable for providing the first stress (for storing a logical zero) or the second stress (for storing a logical one) in the layer of stress-creating material of the storage transistor 1101.

Figure 13:
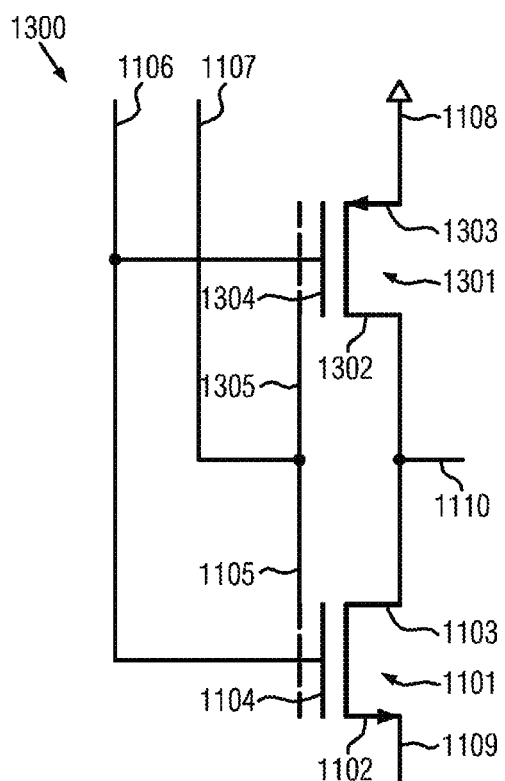
FIG. 13 shows a schematic circuit diagram of a memory cell according to an embodiment.

FIG. 13 shows a schematic circuit diagram of a memory cell 1300 according to an embodiment. Some features of the memory cell 1300 may correspond to features of the memory cell 1100 described above with reference to FIG. 11. In FIGS. 13 and 11, corresponding features have been denoted by like reference numerals, and features of components of the memory cell 1300 may correspond to features of components of the memory cell 1100 denoted by like reference numerals. Similar to the memory cell 1100, the memory cell 1300 includes a storage transistor 1101 including a source region 1102, a drain region 1103 and a gate electrode 1104. A stress-control contact 1105 is electrically connected to a stress-control electrode for applying an electric field to a layer of stress-creating material.

Additionally, the memory cell 1300 includes a storage transistor 1301 that is electrically connected in series with the storage transistor 1101 between a high voltage power supply terminal 1108 and a low voltage power supply terminal 1109. Drain regions of the transistors 1101, 1301 are electrically connected to a bit line terminal 1110.

Similar to the storage transistor 1101, the storage transistor 1301 may have a configuration corresponding to that of the transistor 302 described above with reference to FIGS. 3a and 3b. Storage transistor 1301 may be a P-channel transistor and storage transistor 1101 may be an N-channel transistor. Further features of the storage transistor 1301 may correspond to features of the storage transistor 1101. In particular, the storage transistor 1301 may include a layer of a stress-creating material that is formed of substantially the same material as the layer of stress-creating material of storage transistor 1101. A stress-control contact 1304 of the storage transistor 1301 may be electrically connected to a stress-control electrode that is provided on a side of the layer of stress-creating material of the storage transistor 1301 opposite the gate electrode 1304.

The stress-control contacts 1105, 1305 of the storage transistors 1101, 1301 may be electrically connected to each other and to a write terminal 1107. The gate electrodes 1104, 1304 may be electrically connected to each other and to a read terminal 1106. Hence, electric fields applied to the layers of stress-creating material of the storage transistors 1101, 1301 may be approximately equal and, since the layers of stress-creating material of the storage transistors 1101, 1301 may be formed of substantially the same material, the stress provided in the channel regions of the storage transistors 1101, 1301 may be approximately equal.

However, since storage transistor 1101 is an N-channel transistor and storage transistor 1301 is a P-channel transistor, the influence of the stress on the conductivities of the storage transistors 1301, 1101 is different. A particular stress that increases the conductivity of the channel region of the storage transistor 1301 may decrease the conductivity of the channel region of the storage transistor 1101, and a stress increasing the conductivity of the channel region of the storage transistor 1101 may decrease the conductivity of the channel region of the storage transistor 1301.

Figure 14:
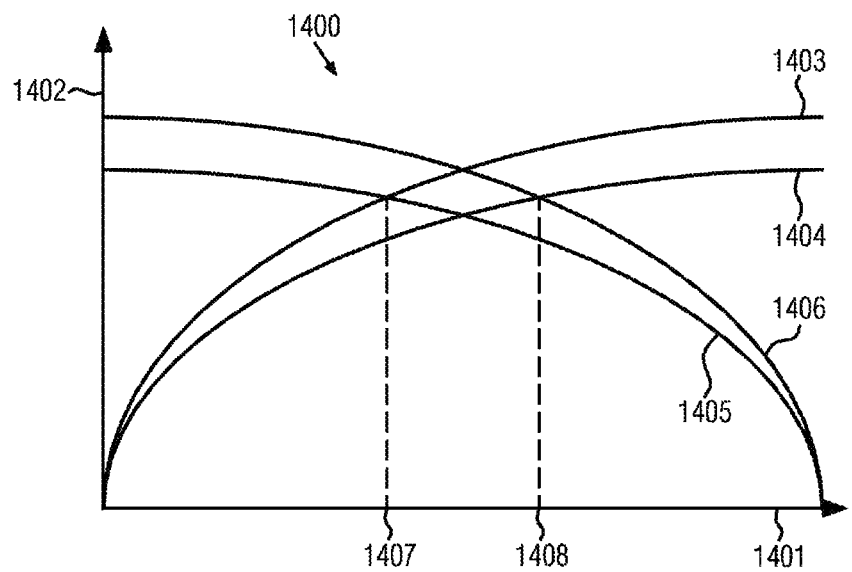
FIG. 14 shows a schematic diagram illustrating an operation of the memory cell of FIG. 13.

The operation of the memory cell 1300 will be explained with reference to FIG. 14. FIG. 14 shows a schematic diagram 1400 illustrating a relationship between a voltage of the bit line terminal 1110 and currents through the storage transistors 1101, 1301. Similar to the memory cell 1100 described above with reference to FIG. 11, the bit line terminal 1110 may be electrically connected to a sense amplifier having a high input impedance, so that substantially no current flows through the bit line terminal 1110. Thus, a current flowing through the storage transistor 1101 may be approximately equal to a current flowing through the storage transistor 1301.

In FIG. 14, a horizontal coordinate axis 1401 denotes the voltage of the bit line terminal 1110, and a vertical coordinate axis 1402 denotes the currents through the storage transistors 1101, 1301. Curves 1403, 1404 schematically illustrate a relationship between the current through the storage transistor 1101 and the voltage of the bit line terminal 1110 for a first stress and a second stress, respectively, wherein the first stress is more tensile or less compressive than the second stress, similar to curves 1203, 1204 shown in FIG. 12.

Curves 1405, 1406 schematically illustrate the relationship between the voltage of the bit line terminal 1110 and the current through the storage transistor 1301 for the first stress and the second stress, respectively. Due to the different influence of stress on the conductivity of the channel region in P-channel transistors and N-channel transistors, in the storage transistor 1301, at the first stress, a smaller current is obtained at a given source-gate voltage than at the second stress.

Since the currents through the storage transistors 1101, 1301 are approximately equal, the voltage of the bit line terminal 1110 that is obtained at the first stress corresponds to an intersection between curves 1403, 1405, and the voltage of the bit line terminal 1110 obtained at the second stress corresponds to an intersection of the curves 1404 and 1406. Thus, at the first stress, a voltage 1407 is obtained, and a voltage 1408 is obtained at the second stress.

Reading data from and writing data to the memory cell 1300 may be performed in the same way as in the memory cell 1100 described above with reference to FIG. 11. However, since, in the memory cell 1300, the stress in the channel region is varied both in the storage transistor 1101 and the storage transistor 1301, a greater signal margin corresponding to a difference between the voltages 1408, 1407 may be obtained.

Figure 15:
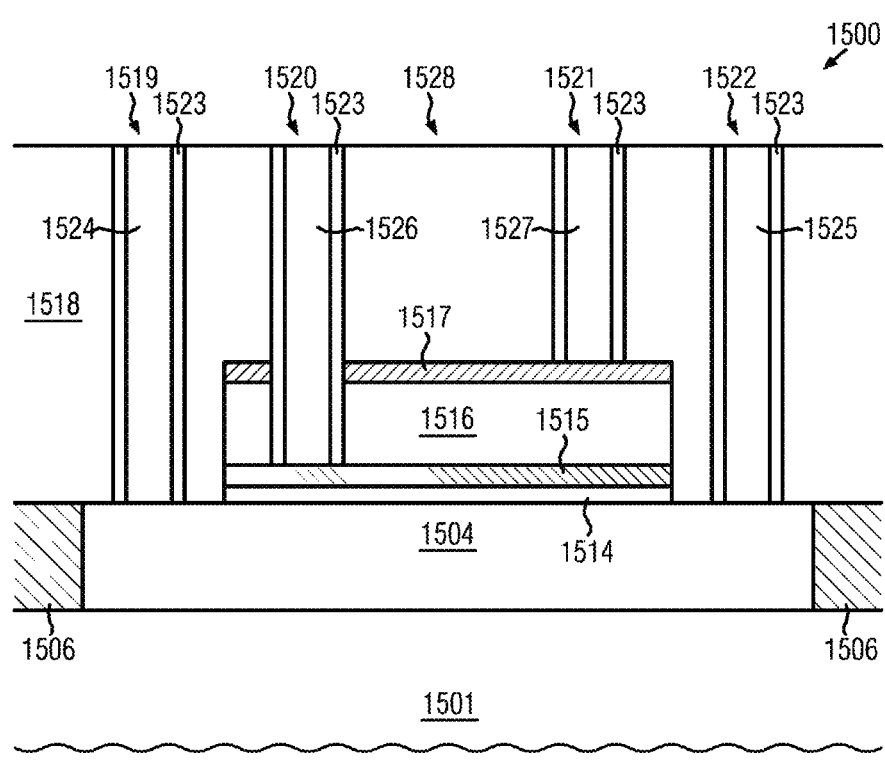
FIG. 15 shows a schematic cross-sectional view of a semiconductor structure according to an embodiment.

FIG. 15 shows a schematic cross-sectional view of a semiconductor structure 1500 including a resistor 1528 according to an embodiment. The semiconductor structure 1500 includes a substrate 1501 including a trench isolation structure 1506 that separates the resistor 1528 from other circuit elements in the semiconductor structure 1500. Features of the substrate 1501 and the trench isolation structure 1506 may correspond to those of the substrate 101 and the trench isolation structure 106 described above with reference to FIGS. 1-1e, and corresponding methods may be used for the formation thereof.

The resistor 1528 further comprises a semiconductor region 1504 formed in the substrate 1501. The semiconductor region 1504 may be differently doped than a portion of the substrate 1501 below the semiconductor region 1504, so that there is a PN transition between the semiconductor region 1504 and the portion of the substrate 1501 below the semiconductor region 1504. The PN transition may provide electrical insulation between the semiconductor region 1504 and the portion of the substrate 1501 below the semiconductor region 1504. The semiconductor region 1504 may be formed by means of ion implantation, similar to the source and drain regions 104, 105 described above with reference to FIGS. 1a-1e.

Above the semiconductor region 1504, an electrically insulating layer 1514, a bottom stress control electrode 1515, a layer 1516 of stress-creating material and a top stress control electrode 1517 may be provided. The electrically insulating layer 1514, the bottom stress control electrode 1515, the layer 1516 of stress-creating material and the top stress control electrode 1517 may have features corresponding to those of the electrically insulating layer 114, the bottom stress control electrode 115, the layer 116 of stress-creating material and the top stress-control electrode 117 described above with reference to FIGS. 1a-1e, and corresponding techniques, including methods of deposition and/or etching, may be used for the formation thereof.

The semiconductor structure 1500 further comprises a dielectric material 1518 formed above the resistor 1528. In the dielectric material 1518, contact vias 1519, 1520, 1521 and 1522 may be formed. An electrically insulating liner layer 1523 may be formed at the sidewalls of the contact vias 1519, 1520, 1521, 1522.

In the contact vias 1519, 1522, resistor contacts 1524, 1525 may be formed, which provide electrical connection to ends of the semiconductor regions 1504. An electric current may flow between the resistor contacts 1524, 1525 through the semiconductor region 1504, wherein the semiconductor region 1504 may provide a substantially ohmic resistance to the electric current.

In the contact vias 1520, 1521, stress control contacts 1526, 1527 providing electrical connection to the bottom stress control electrode 1515 and the top stress control electrode 1517, respectively, may be provided.

Further features of the dielectric material, the contact vias 1519, 1520, 1521, 1522, the liner layer 1523, the resistor contacts 1524, 1525 and the stress control contacts 1526, 1527 may correspond to those of the dielectric material 118, the contact vias 119-123, the liner layer 124 and the contacts 125-129 described above with reference to FIGS. 1a-1e, and corresponding methods may be used for the formation thereof.

By applying an electric voltage between the stress control contacts 1526, 1527, an electric field may be created between the bottom stress control electrode 1515 and the top stress control electrode 1517. In response to the electric field, the layer 1516 of stress-creating material may provide a stress whose strength depends on the electric voltage applied between the stress control contacts 1526, 1527.

The stress provided by the layer 1516 of stress-creating material may provide a stress in the semiconductor region 1504 below the layer 1516 of stress-creating material, which may influence the mobility of charge carriers (electrons or holes, depending on whether the semiconductor material 1504 is N-doped or P-doped). An increase of the mobility of charge carriers in the semiconductor material 1504 may lead to a smaller resistance of the semiconductor region 1504, and a reduction of the mobility of the charge carriers may lead to a greater resistance of the semiconductor region 1504. Thus, the resistance provided by the resistor 1528 may be controlled by varying the voltage applied between the stress control contacts 1526, 1527.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A circuit element, comprising:
   a semiconductor region; and
   a layer of a stress-creating material, said stress-creating material providing a stress that is variable in response to a signal acting on said stress-creating material;
   wherein said layer of stress-creating material is arranged to provide a stress in said semiconductor region, said stress provided in said semiconductor region being variable in response to said signal acting on said stress-creating material.

2. The circuit element of claim 1, wherein said circuit element comprises a transistor comprising a source region, a drain region, a channel region and a gate electrode, and said semiconductor region wherein the variable stress is provided comprises at least said channel region.

3. The circuit element of claim 2, wherein said signal acting on said layer of stress-creating material comprises at least one of an electric field, an electric current and a magnetic field.

4. The circuit element of claim 3, wherein said layer of stress-creating material comprises at least one of a piezoelectric material, an electrostrictive material, a magnetostrictive material and a current-strictive material.

5. The circuit element of claim 2, wherein said layer of stress-creating material comprises at least one of an electrostrictive material and a piezoelectric material, said circuit element comprising at least one stress-control electrode adjacent said layer of stress-creating material for applying an electric field to said layer of stress-creating material, said electric field providing said signal acting on said stress-creating material.

6. The circuit element of claim 5, wherein said at least one stress-control electrode comprises a first and a second stress-control electrode provided on opposite sides of said layer of stress-creating material.

7. The circuit element of claim 5, wherein said at least one stress-control electrode is provided on a side of said layer of stress-creating material that is opposite said gate electrode, wherein a voltage difference between said gate electrode and said stress-control electrode creates the electric field providing said signal acting on said stress-creating material.

8. The circuit element of claim 2, wherein said layer of stress-creating material is formed above said source region, said drain region and said gate electrode.

9. The circuit element of claim 2, wherein said source region, said drain region and said channel region are formed in a semiconductor material, said gate electrode is formed above said semiconductor material, and said layer of stress-creating material is formed above said semiconductor material and said gate electrode.

10. The circuit element of claim 2, wherein said stress-creating material has a stress hysteresis, wherein at least a portion of said stress provided in response to said signal is maintained after removal of said signal.

11. The circuit element according to claim 10, wherein said stress-creating material comprises at least one of [Pb(Zn$_{1/3}$Nb$_{2/3}$)O$_3$]$_{(1-x)}$—[PbTiO$_3$]$_x$, wherein x is greater than 0 and less than about 0.1, [Pb(Mg$_{1/3}$Nb$_{2/3}$)O$_3$]$_{(1-x)}$—[PbTiO$_3$]$_x$, wherein x is greater than 0 and less than about 0.5, and 0.99[Bi$_{1/2}$(Na$_{0.82}$K$_{0.18}$)$_{1/2}$(Ti$_{1-x}$Zr$_x$)O$_3$]-0.01LiSbO$_3$, wherein x is in a range from about 0 to about 0.03.

12. The circuit element of claim 11, wherein said stress-creating material comprises [Pb(Mg$_{1/3}$Nb$_{2/3}$)O$_3$]$_{(1-x)}$—[PbTiO$_3$]$_x$, wherein x is in a range from about 0.3 to about 0.4.

13. The circuit element of claim 2, wherein said stress-creating material has at least one of substantially no stress hysteresis and a small stress hysteresis.

14. The circuit element of claim 13, wherein said stress-creating material comprises Pb(Mg$_{1/3}$Nb$_{2/3}$)O$_3$.

15. The circuit element of claim 2, wherein said stress-creating material comprises at least one of a relaxor ferroelectric and a piezoceramic material.

16. A method, comprising:
providing a substrate comprising a semiconductor material;
forming a gate insulation layer and a gate electrode over said semiconductor material;
forming a source region and a drain region in said semiconductor material adjacent said gate electrode, a portion of said semiconductor material below said gate electrode providing a channel region; and
forming a layer of a stress-creating material over said source region, said drain region and said gate electrode, said stress-creating material providing a stress in said channel region that is variable in response to a signal acting on said stress-creating material.

17. The method of claim 16, wherein said layer of stress-creating material comprises a magnetostrictive material, and wherein the method further comprises:
forming a dielectric material over said layer of stress-creating material; and
forming a source contact providing an electrical connection to said source region, a drain contact providing an electrical connection to said drain region and a gate contact providing an electrical connection to said gate electrode in said dielectric material.

18. The method of claim 16, wherein said layer of stress-creating material comprises at least one of an electrostrictive material and a piezoelectric material, and wherein the method further comprises:
forming a first stress-control electrode over said layer of stress-creating material;
forming a dielectric material over said first stress-control electrode; and
forming a source contact providing an electrical connection to said source region, a drain contact providing an electrical connection to said drain region, a gate contact providing an electrical connection to said gate electrode and a first stress-control contact providing an electrical connection to said first stress-control electrode in said dielectric material.

19. The method of claim 16, wherein the formation of said layer of stress-creating material comprises performing a pulsed laser deposition process.

20. The method of claim 19, wherein at least one of [Pb(Zn$_{1/3}$Nb$_{2/3}$)O$_3$]$_{(1-x)}$—[PbTiO$_3$]$_x$, wherein x is greater than 0 and less than about 0.1, [Pb(Mg$_{1/3}$Nb$_{2/3}$)O$_3$]$_{(1-x)}$—[PbTiO$_3$]$_x$, wherein x is greater than 0 and less than about 0.5, in particular in a range from about 0.3 to about 0.4, Pb(Mg$_{1/3}$Nb$_{2/3}$)O$_3$, 0.99[Bi$_{1/2}$(Na$_{0.82}$K$_{0.18}$)$_{1/2}$(Ti$_{1-x}$Zr$_x$)O$_3$]-0.01LiSbO$_3$, wherein x is in a range from about 0 to about 0.03, a relaxor ferroelectric and a piezoceramic material is deposited in said pulsed laser deposition process.

21. A circuit element, comprising:
a semiconductor region;
a layer of a stress-creating material, said stress-creating material providing a stress that is variable in response to a signal acting on said stress-creating material, wherein said layer of stress-creating material is arranged to provide a stress in said semiconductor region, said stress provided in said semiconductor region being variable in response to said signal acting on said stress-creating material; and
a resistor, wherein said semiconductor region is electrically connected between a first resistor contact and a second resistor contact and provides a substantially ohmic resistance that is variable in response to the variable stress provided by said layer of stress-creating material.

22. The circuit element of claim 21, wherein said layer of stress-creating material comprises at least one of an electrostrictive and a piezoelectric material, and wherein said circuit element further comprises at least one stress-control electrode adjacent said layer of stress-creating material, said electric field providing said signal acting on said stress-creating material.

23. The circuit element of claim 22, wherein said stress-creating material has a stress hysteresis, wherein at least a portion of said stress provided in response to said signal is maintained after removal of said signal.

24. The circuit element of claim 22, wherein said stress-creating material has at least one of substantially no stress hysteresis and a small stress hysteresis.

25. A method, comprising:
providing a substrate comprising a semiconductor material;
forming a gate insulation layer and a gate electrode over said semiconductor material;
forming a source region and a drain region in said semiconductor material adjacent said gate electrode, a portion of said semiconductor material below said gate electrode providing a channel region;
forming an electrically insulating layer over said source region, said drain region and said gate electrode;
forming a first stress-control electrode over said electrically insulating layer;
forming a layer of a stress-creating material comprising at least one of an electrostrictive material and a piezoelectric material over said first stress-control electrode and over said source region, said drain region and said gate electrode, said stress-creating material providing a stress in said channel region that is variable in response to a signal acting on said stress-creating material;
forming a second stress-control electrode over said layer of stress-creating material;
forming a dielectric material over said first stress-control electrode; and
forming a source contact providing an electrical connection to said source region, a drain contact providing an electrical connection to said drain region, a gate contact providing an electrical connection to said gate electrode and a first stress-control contact providing an electrical connection to said second stress-control electrode in said dielectric material.

26. The method of claim 25, further comprising forming a second stress-control contact providing an electrical connection to said second stress-control electrode in said dielectric material.

* * * * *